(12) United States Patent
Oka

(10) Patent No.: US 11,069,545 B2
(45) Date of Patent: Jul. 20, 2021

(54) SUBSTRATE PROCESSING APPARATUS, TEMPERATURE CONTROL METHOD, AND TEMPERATURE CONTROL PROGRAM

(71) Applicant: TOKYO ELECTRON LIMITED, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 746 days.

(21) Appl. No.: 15/874,106

(22) Filed: Jan. 18, 2018

(65) Prior Publication Data

US 2018/0211853 A1   Jul. 26, 2018

(30) Foreign Application Priority Data

Jan. 19, 2017   (JP) .............................. JP2017-007878
Dec. 14, 2017   (JP) .............................. JP2017-239167

(51) Int. Cl.
*H01L 21/67*   (2006.01)
*H01L 21/66*   (2006.01)
*H01J 37/32*   (2006.01)

(52) U.S. Cl.
CPC .. *H01L 21/67103* (2013.01); *H01J 37/32724* (2013.01); *H01L 21/67069* (2013.01); *H01L 21/67248* (2013.01); *H01L 21/67253* (2013.01); *H01L 22/20* (2013.01)

(58) Field of Classification Search
CPC ......... H01L 21/67103; H01L 21/67069; H01L 21/67248; H01L 21/67253; H01L 22/20; H01J 37/32724
See application file for complete search history.

(56) References Cited

U.S. PATENT DOCUMENTS

| 2011/0143462 A1* | 6/2011 | Gaff ........................ H01J 37/20 438/9 |
| 2012/0012556 A1* | 1/2012 | Matsumoto ....... H01L 21/32137 216/69 |
| 2015/0132863 A1* | 5/2015 | Oohashi ............ H01L 21/67248 438/5 |

FOREIGN PATENT DOCUMENTS

JP   2016-178316 A   10/2016

* cited by examiner

*Primary Examiner* — Omar F Fernandez Rivas
*Assistant Examiner* — Joshua E. Jensen
(74) *Attorney, Agent, or Firm* — Rothwell, Figg, Ernst & Manbeck, P.C.

(57) ABSTRACT

A substrate processing apparatus includes: a placing table having a placement surface and provided with a heater in each divided region obtained by dividing the placement surface; a calculation unit that calculates a target temperature of the heater in each divided region in which a critical dimension at a predetermined measurement point satisfies a predetermined condition, using a prediction model that predicts the critical dimension of the measurement point by using a temperature of the heater in each divided region as a parameter and taking into consideration an influence of a temperature of a heater in a divided region other than a divided region including the measurement point in accordance with a distance between the measurement point and the other divided region; and a heater controller that controls the heater in each divided region to reach the target temperature when the substrate processing is performed on the substrate.

13 Claims, 14 Drawing Sheets

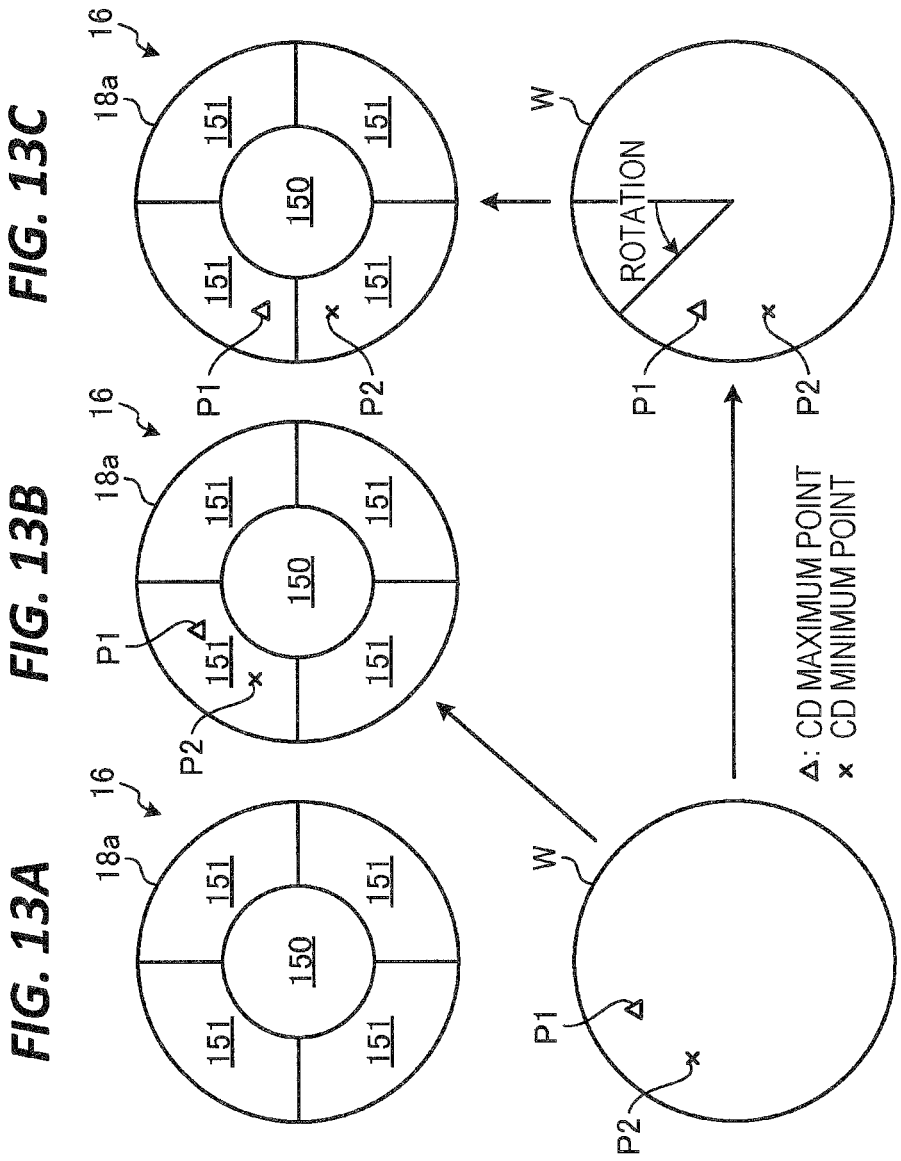

SUBSTRATE PROCESSING APPARATUS, TEMPERATURE CONTROL METHOD, AND TEMPERATURE CONTROL PROGRAM

CROSS-REFERENCE TO RELATED APPLICATIONS

This application is based on and claims priority from Japanese Patent Application Nos. 2017-007878 and 2017-239167 filed on Jan. 19, 2017 and Dec. 14, 2017, respectively, with the Japan Patent Office, the disclosures of which are incorporated herein in their entirety by reference.

TECHNICAL FIELD

Various aspects and exemplary embodiments of the present disclosure relate to a substrate processing apparatus, a temperature control method, and a temperature control program.

BACKGROUND

As the semiconductor technology generation advances, the diameter of substrates (e.g., wafers) is increasing. Meanwhile, transistors tend to be miniaturized. Therefore, higher precisions are required for a substrate processing.

One of precisions with respect to the substrate processing is a uniformity of the critical dimension in the substrate. In the substrate processing, the progress of processing varies depending on the temperature of the substrate. Thus, in the substrate processing apparatus, in order to control the temperature of the substrate more highly, a placement surface of a placing table on which the substrate is placed is divided into a plurality of divided regions, and a heater is provided for each divided region. Then, the temperature of each divided region is adjusted such that the critical dimension at a predetermined position satisfies a predetermined condition. For example, a set value of the heater for each divided region is obtained based on a matrix describing a relationship between a control parameter of each divided region on the placement surface and an expected temperature of the predetermined position of the substrate (see, e.g., Japanese Patent Laid-Open Publication No. 2016-178316).

SUMMARY

In an exemplary embodiment of the present disclosure, a substrate processing apparatus includes a placing table, a calculation unit, and a heater controller. The placing table includes a placement surface on which one or both of a substrate and a ring member arranged to surround the substrate are placed. The placement surface is divided into a plurality of regions in each of which a heater is provided so as to adjust a temperature therein. The calculation unit is configured to calculate a target temperature of the heater in each divided region in which critical dimension at a predetermined measurement point of the substrate satisfies a predetermined condition when a predetermined substrate processing is performed on the substrate placed on the placement surface, using a prediction model to predict the critical dimension at the measurement point based on a temperature of the heater in each divided region as a parameter and by taking into consideration an influence of a temperature of a heater in another divided region other than a divided region including the measurement point, according to a distance between the measurement point and the another divided region. The heater controller is configured to control the heater in each divided region to reach the target temperature calculated by the calculation unit when the substrate processing is performed on the substrate placed on the placement surface.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 13A to 13C are diagrams schematically illustrating the maximum point and the minimum point of the CD on the wafer.

DETAILED DESCRIPTION

Figure 1:
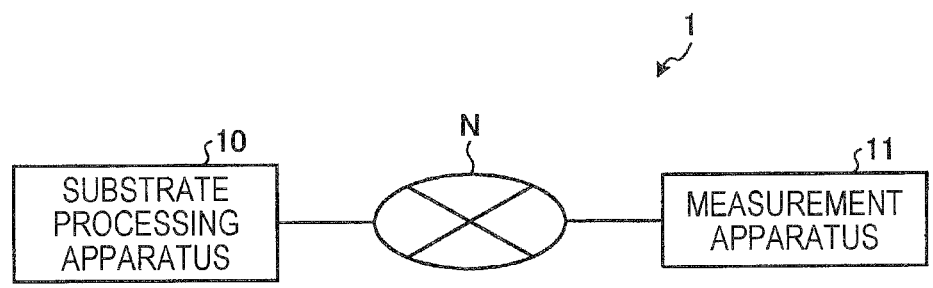
FIG. 1 is a schematic configuration diagram of a substrate processing system according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the case where the placement surface of the placing table is divided into a plurality of divided regions so that the temperature of each divided region is adjusted, the temperature in the vicinity of the boundary between adjacent divided regions varies under the influence of the adjacent divided regions. For this reason, in the related art, the temperature in the vicinity of the boundary between adjacent divided regions may not become the expected temperature in some cases. Thus, the critical dimension may not be controlled so as to satisfy the predetermined condition in the vicinity of the boundary. As a result, in the related art, it is not possible to accurately control the uniformity of the critical dimension in the substrate.

Further, in the substrate processing apparatus, a heater may also be provided in a peripheral region of the substrate. In such a configuration, the substrate processing apparatus may not be controlled such that the critical dimension satisfies a predetermined condition in the vicinity of the outer edge portion of the substrate under the influence of the heater in the peripheral region.

In an exemplary embodiment of the present disclosure, a substrate processing apparatus includes a placing table, a calculation unit, and a heater controller. The placing table includes a placement surface on which one or both of a substrate and a ring member arranged to surround the substrate are placed. The placement surface is divided into a plurality of regions in each of which a heater is provided so as to adjust a temperature therein. The calculation unit is configured to calculate a target temperature of the heater in each divided region in which critical dimension at a predetermined measurement point of the substrate satisfies a predetermined condition when a predetermined substrate processing is performed on the substrate placed on the placement surface, using a prediction model to predict the critical dimension at the measurement point based on using a temperature of the heater in each divided region as a parameter and by taking into consideration an influence of a temperature of a heater in another divided region other than a divided region including the measurement point, according to a distance between the measurement point and the another divided region. The heater controller is configured to control the heater in each divided region to reach the target temperature calculated by the calculation unit when the substrate processing is performed on the substrate placed on the placement surface.

In the above-described substrate processing apparatus, the calculation unit is configured to calculate the target temperature of the heater in each divided region in which critical dimension at the measurement point of the substrate satisfies the predetermined condition, using a prediction model to predict the critical dimension at the measurement point by taking into consideration the influence of the temperature of the heater in an adjacent divided region to the divided region including the measurement point, according to the distance between the measurement point and the adjacent divided region.

In the above-described substrate processing apparatus, a plurality of measurement points are determined on the substrate, and the calculation unit is configured to calculate the target temperature of the heater in each divided region in which a difference between a maximum value and a minimum value in the critical dimension at each measurement point or a square sum of errors in the critical dimension at each measurement point is minimized, by calculating, using the prediction model, a temperature of the heater in each divided region in which the square sum of errors in the critical dimension at each measurement point with respect to a target dimension is minimized, and changing the temperature of the heater in each divided region based on the calculated temperature of each divided region.

In the above-described substrate processing apparatus, the calculation unit is configured to calculate the target temperature of the heater in each divided region in which the difference between the maximum value and the minimum value in the critical dimension at each measurement points or the square sum of errors in the critical dimension at each measurement point is minimized in a range of a predetermined specification of the average value of the critical dimension at each measurement point, by changing the temperature of the heater in each divided region based on the calculated temperature of each divided region.

The above-described substrate processing apparatus further includes a generation unit configured to generate the prediction model from data obtained by measuring the critical dimension at the measurement point when the substrate processing is performed on the substrate by controlling the heater in each divided region to three or more temperatures. The calculation unit is configured to calculate the target temperature of the heater in each divided region in which the critical dimension at the measurement point satisfies the predetermined condition, using the prediction model generated by the generation unit.

In the above-described substrate processing apparatus, the generation unit is configured to generate a first prediction model obtained by modeling the critical dimension at the measurement point by a linear function of the temperature of the heater, and a second prediction model obtained by the critical dimension at the measurement point by a quadric or higher-order function of the temperature of the heater or a sum of an exponential function of a reciprocal of an absolute temperature of the heater and a constant, and the calculation unit is configured to calculate, using the second prediction model, the target temperature of the heater in each divided region in which the difference between the maximum value and the minimum value in the critical dimension at each measurement point is minimized by, calculating, using the first prediction model, a temperature of the heater in each divided region in which the square sum of errors in the critical dimension is minimized, and changing the temperature of the heater in each divided region based on the calculated temperature of each divided region.

In the above-described substrate processing apparatus, the substrate processing is plasma etching, and the critical dimension is a width of an etching pattern.

In the above-described substrate processing apparatus, the ring member is one or both of a focus ring and an insulator ring.

The above-described substrate processing apparatus further includes an arrangement controller that controls an arrangement of the substrate with respect to the placing table such that a maximum point at which the critical dimension at the measurement point of the substrate is maximized and a minimum point at which the critical dimension is minimized are positioned in different divided regions when the maximum point and the minimum point are positioned in the same divided region.

In the above-described substrate processing apparatus, the substrate has a disc shape. In the placing table, at least a part of each divided region obtained by dividing the placement surface is provided along a circumferential direction of the substrate. When the maximum point and the minimum point are positioned in the same divided region provided along the circumferential direction of the substrate, the arrangement controller performs a control to rotate the substrate in the circumferential direction such that the maximum point and the minimum point are positioned in different divided regions.

In an exemplary embodiment of the present disclosure, a computer-implemented temperature control method includes calculating a target temperature of a heater in each divided region in which a critical dimension at a predetermined measurement point of a substrate satisfies a predetermined condition when a predetermined substrate processing is performed on the substrate placed on a placement surface configured to place thereon one or both of the substrate and a ring member arranged to surround the substrate and provided in a placing table, the placement surface being divided into a plurality of regions in each of which a heater is provided so as to adjust a temperature therein, using a prediction model to predict the critical dimension at the measurement point based on a temperature of the heater in each divided region as a parameter and by taking into consideration an influence of a temperature of a heater in another divided region other than a divided region including the measurement point, according a distance between the measurement point and the another divided region; and controlling the heater in each divided region to reach the target temperature calculated by the calculation unit when the substrate processing is performed on the substrate placed on the placement surface.

In an exemplary embodiment of the present disclosure, non-transitory computer-readable storage medium stores a temperature control program which, when executed, causes a computer to execute a processing including: calculating a target temperature of a heater in each divided region in which a critical dimension at a predetermined measurement point of a substrate satisfies a predetermined condition when a predetermined substrate processing is performed on the substrate placed on a placement surface configured to place thereon one or both of the substrate and a ring member arranged to surround the substrate and provided in a placing table, the placement surface being divided into a plurality of regions in each of which a heater is provided so as to adjust a temperature therein, using a prediction model to predict the critical dimension at the measurement point based on a temperature of the heater in each divided region as a parameter and by taking into consideration an influence of a temperature of a heater in another divided region other than a divided region including the measurement point, according to a distance between the measurement point and the another divided region; and controlling the heater in each divided region to reach the target temperature calculated by the calculation unit when the substrate processing is performed on the substrate placed on the placement surface.

According to an aspect of the substrate processing apparatus of the present disclosure, it is possible to control the temperature of the heater in each divided region such that the critical dimension of the measurement point of the substrate satisfies the predetermined condition.

Hereinafter, exemplary embodiments of the substrate processing apparatus, the temperature control method, and the temperature control program disclosed herein will be described in detail with reference to drawings. Meanwhile, in the respective drawings, the same or corresponding parts will be denoted by the same symbols. Further, the present disclosure is not limited to the embodiments disclosed herein. The respective embodiments may be appropriately combined within a range that does not contradict the processing contents.

First Exemplary Embodiment

<Configuration of Substrate Processing System>

First, a schematic configuration of a substrate processing system according to an exemplary embodiment will be described. The substrate processing system is a system that performs a predetermined substrate processing on a substrate such as, for example, a wafer. In the present exemplary embodiment, descriptions will be made on an exemplary case where plasma etching is performed as a substrate processing on a substrate. FIG. 1 is a schematic configuration diagram of a substrate processing system according to an exemplary embodiment. A substrate processing system 1 includes a substrate processing apparatus 10 and a measurement apparatus 11. The substrate processing apparatus 10 and the measurement apparatus 11 are connected to each other via a network N to communicate with each other. Any type of communication network (e.g., local area network (LAN) or virtual private network (VPN)) may be adopted as the network N regardless of whether it is wired or wireless.

The substrate processing apparatus 10 is an apparatus that performs a predetermined substrate processing on a substrate. In the present exemplary embodiment, the substrate processing apparatus 10 performs plasma etching on a semiconductor wafer (hereinafter, referred to as a "wafer") as a substrate.

The measurement apparatus 11 is an apparatus that measures a critical dimension at a measurement point which is a predetermined position of the substrate on which the substrate processing has been performed by the substrate processing apparatus 10. In the present exemplary embodiment, the measurement apparatus 11 measures, as the critical dimension, a width of the pattern at the measurement point. Hereinafter, the critical dimension is also referred to as a "CD." A plurality of measurement points are provided at different positions on the wafer to measure the CD. The measurement apparatus 11 measures the width of the pattern at each measurement point. The measurement apparatus 11 may be an inspection apparatus that inspects defects on a substrate. The measurement apparatus 11 transmits the data of the CD measured at each measurement point to the substrate processing apparatus 10.

In the substrate processing apparatus 10, the placement surface on which the wafer is placed is divided into a plurality of divided regions, and based on the data of the CD at each measurement point received from the measurement apparatus 11, the temperature of each divided region is controlled such that the CD at each measurement point of the wafer satisfies a predetermined condition.

<Configuration of Substrate Processing Apparatus>

Figure 2:
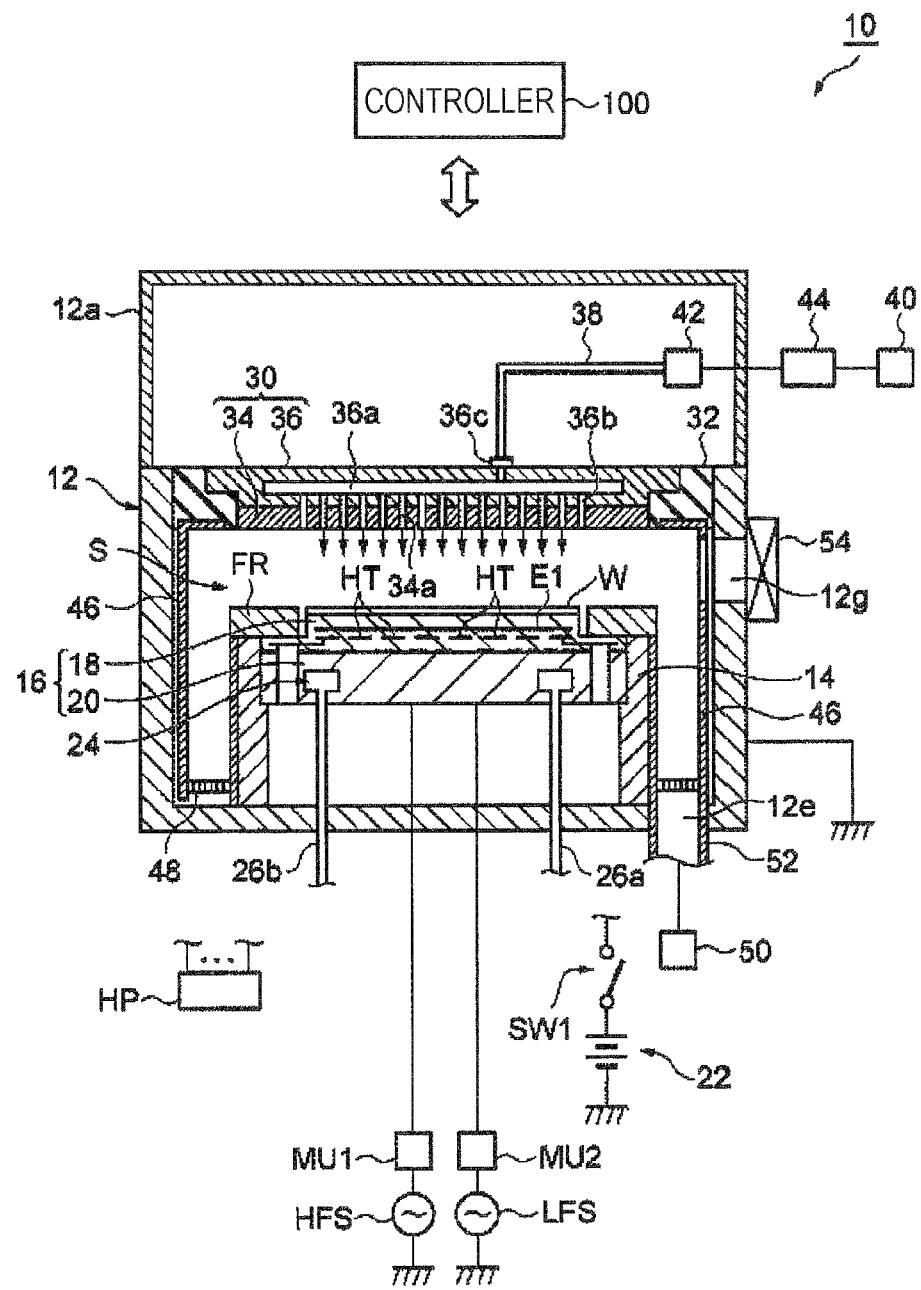
FIG. 2 is a view schematically illustrating a substrate processing apparatus according to the exemplary embodiment.

Next, the configuration of the substrate processing apparatus 10 will be described. FIG. 2 is a view schematically illustrating a substrate processing apparatus according to the exemplary embodiment. FIG. 2 schematically illustrates a structure in a vertical section of the substrate processing apparatus 10 according to an exemplary embodiment. The substrate processing apparatus 10 illustrated in FIG. 2 is a capacitively coupled parallel plate plasma etching apparatus. The substrate processing apparatus 10 includes a substantially cylindrical processing container 12. The processing container 12 is made of, for example, aluminum. In addition, the surface of the processing container 12 is subjected to an anodic oxidation treatment.

A placing table 16 is provided in the processing container 12. The placing table 16 includes a support member 18 and a base 20. The upper surface of the support member 18 serves as a placement surface on which a substrate to be subjected to the substrate processing is placed. In the present exemplary embodiment, a wafer W to be subjected to plasma etching is placed on the upper surface of the support member 18. The base 20 has a substantially disc shape, and the main portion thereof is made of a conductive metal such as, for example, aluminum. The base 20 constitutes a lower electrode. The base 20 is supported by the support portion 14. The support portion 14 is a cylindrical member extending from the bottom portion of the processing container 12.

The base 20 is electrically connected with a first high frequency power source HFS via a matcher MU1. The first high frequency power source HFS is a power source for generating a high frequency power for plasma generation and generates a high frequency power with a frequency of 27 MHz to 100 MHz, for example, 40 MHz. The matcher MU1 includes a circuit to match the output impedance of the first high frequency power source HFS and the input impedance of the load side (the base 20 side).

Further, the base 20 is electrically connected with a second high frequency power source LFS via a matcher MU2. The second high frequency power source LFS generates a high frequency power (a high frequency bias power) for drawing ions into the wafer W, and supplies the high frequency bias power to the base 20. The frequency of the high frequency bias power is a frequency within a range of 400 kHz to 13.56 MHz, and is, for example, 3 MHz. The matcher MU2 includes a circuit to match the output impedance of the second high frequency power source LFS and the input impedance of the load side (the base 20 side).

The support member 18 is provided on the base 20. In an exemplary embodiment, the support member 18 is an electrostatic chuck. The support member 18 attracts the wafer W by electrostatic force (e.g., Coulomb force) and holds the wafer W. The support member 18 has an electrostatic chucking electrode E1 in a ceramic main body. The electrode E1 is electrically connected with a DC power source 22 via a switch SW1.

A ring member is disposed on the upper surface of the base 20 and around the support member 18 so as to surround the wafer W. For example, a focus ring FR is provided as the ring member on the upper surface of the base 20 and around the support member 18. The focus ring FR is provided to enhance the uniformity of the plasma processing. The focus ring FR is made of a material appropriately selected depending on the plasma processing to be performed, and may be made of, for example, silicon or quartz.

A coolant flow path 24 is formed inside the base 20. The coolant flow path 24 is supplied with a coolant from a chiller unit provided outside the processing container 12, through a pipe 26a. The coolant supplied to the coolant flow path 24 is configured to be returned to the chiller unit through a pipe 26b. Details of the placing table 16 including the base 20 and the support member 18 will be described later.

An upper electrode 30 is provided in the processing container 12. The upper electrode 30 is disposed to face the base 20 above the placing table 16, and the base 20 and the upper electrode 30 are provided substantially in parallel to each other.

The upper electrode 30 is supported in the upper portion of the processing container 12 through an insulating shielding member 32. The upper electrode 30 may include an electrode plate 34 and an electrode support 36. The electrode plate 34 faces a processing space S, and provides a plurality of gas ejection holes 34a. The electrode plate 34 may be made of a low resistance conductor or a semiconductor having low Joule heat.

The electrode support 36 detachably supports the electrode plate 34, and may be made of a conductive material such as, for example, aluminum. The electrode support 36 may have a water-cooled structure. A gas diffusion chamber 36a is provided inside the electrode support 36. In the gas diffusion chamber 36a, a plurality of gas flowing holes 36b extend downward to be in communication with the gas ejection holes 34a, respectively. Further, the support 36 includes a gas introduction port 36c configured to introduce the processing gas to the gas diffusion chamber 36a. The gas introduction port 36c is connected with a gas supply pipe 38.

The gas supply pipe 38 is connected with a gas source group 40 via a valve group 42 and a flow rate controller group 44. The valve group 42 includes a plurality of opening/closing valves, and the flow rate controller group 44 includes a plurality of flow rate controllers such as, for example, mass flow controllers. In addition, the gas source group 40 has a plurality of gas sources for gases required for the plasma processing. The plurality of gas sources of the gas source group 40 are connected to the gas supply pipe 38 via corresponding opening/closing valves and corresponding mass flow controllers.

In the substrate processing apparatus 10, one or more gases from one or more gas sources selected among the plurality of gas sources of the gas source group 40 are supplied to the gas supply pipe 38. The gases supplied to the gas supply pipe 38 reach the gas diffusion chamber 36a and are ejected into the processing space S through the gas flow holes 36b and the gas ejection holes 34a.

Further, as illustrated in FIG. 2, the substrate processing apparatus 10 may further include a ground conductor 12a. The ground conductor 12a is a substantially cylindrical ground conductor and is provided to extend from the side wall of the processing container 12 to a position higher than the height position of the upper electrode 30.

Further, in the plasma processing apparatus 10, a deposit shield 46 is provided detachably along the inner wall of the processing container 12. In addition, the deposit shield 46 is provided in the outer periphery of the support portion 14. The deposit shield 46 serves to suppress any etching byproduct (deposit) from being attached to the processing container 12, and may be formed by coating an aluminum material with a ceramic (e.g., $Y_2O_3$).

An exhaust plate 48 is provided at the bottom portion side of the processing container 12 between the support portion 14 and the side wall of the processing container 12. The exhaust plate 48 may be formed by coating an aluminum material with a ceramic (e.g., $Y_2O_3$). An exhaust port 12e is formed at the lower side of the exhaust plate 48 in the processing container 12. An exhaust port 12e is connected with an exhaust device 50 via an exhaust pipe 52. The exhaust device 50 includes a vacuum pump such as, for example, a turbo molecular pump, and is capable of decompressing the inside of the processing container 12 to a desired degree of vacuum. A carry-in/out port 12g of the wafer W is formed in the side wall of the processing container 12. The carry-in/out port 12g is configured to be opened/closed by a gate valve 54.

The operation of the substrate processing apparatus 10 configured as described above is generally controlled by the controller 100. The controller 100 is, for example, a computer, and controls each part of the substrate processing apparatus 10. The operation of the substrate processing apparatus 10 is generally controlled by the controller 100.

[Configuration of Placing Table]

Figure 3:
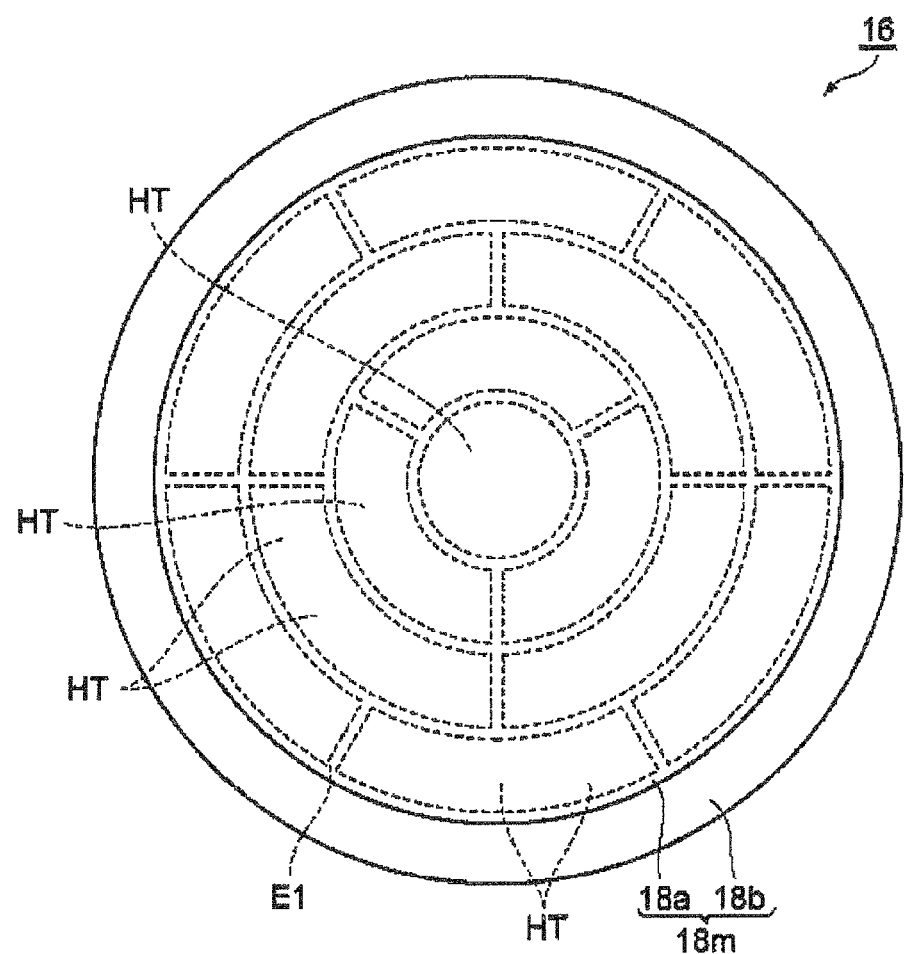
FIG. 3 is a plan view of a placing table according to the exemplary embodiment.

Next, the placing table 16 will be described in detail. FIG. 3 is a plan view of a placing table according to an exemplary embodiment. As described above, the placing table 16 includes a support member 18 and a base 20. The support member 18 has a ceramic main body 18m. The main body 18m has a substantially disc shape. The main body 18m provides a placement region 18a and an outer peripheral region 18b. The placement region 18a is a substantially circular region in a plan view. A wafer W is placed on the upper surface of the placement region 18a. Further, the diameter of the placement region 18a is substantially the same as the diameter of the wafer W or slightly smaller than the diameter of the wafer W. The outer peripheral region 18b is a region surrounding the placement region 18a and extends substantially in a ring shape. In an exemplary embodiment, the upper surface of the outer peripheral region 18b is lower than the upper surface of the placement region 18a.

As described above, in an exemplary embodiment, the support member 18 is an electrostatic chuck. The support member 18 in the exemplary embodiment has an electrostatic attracting electrode E1 in the placement region 18a. As described above, the electrode E1 is electrically connected with a DC power source 22 via a switch SW1.

Further, a plurality of heaters HT are provided in the placement region 18a and below the electrode E1. In an exemplary embodiment, the placement region 18a is divided into a plurality of divided regions, and a heater HT is provided in each of the divided regions. For example, as illustrated in FIG. 3, a plurality of heaters HT are provided in a circular region at the center of the placement region 18a and a plurality of concentric annular regions surrounding the circular region. Further, in each of the plurality of annular regions, a plurality of heaters HT are arranged in the circumferential direction. The dividing method of the divided regions illustrated in FIG. 3 is an example, and is not limited thereto. The placement region 18a may be divided into more divided regions. For example, the placement region 18a may be divided into divided regions having smaller angular width and narrower radial width as they are closer to the outer circumference. The heaters HT are individually connected to a heater power source HP illustrated in FIG. 2 via wirings (not illustrated) provided on the outer peripheral portion of the base 20. Each of the heaters HP is supplied with an individually adjusted power from the heater power source HP. Thus, the heat generated by each of the heaters HT is individually controlled, and the temperatures of the plurality of divided regions within the placement region 18a are individually adjusted. At least one measurement point for measuring the CD of the wafer W is provided in the divided regions provided with the heaters HT.

[Configuration of Controller]

Figure 4:
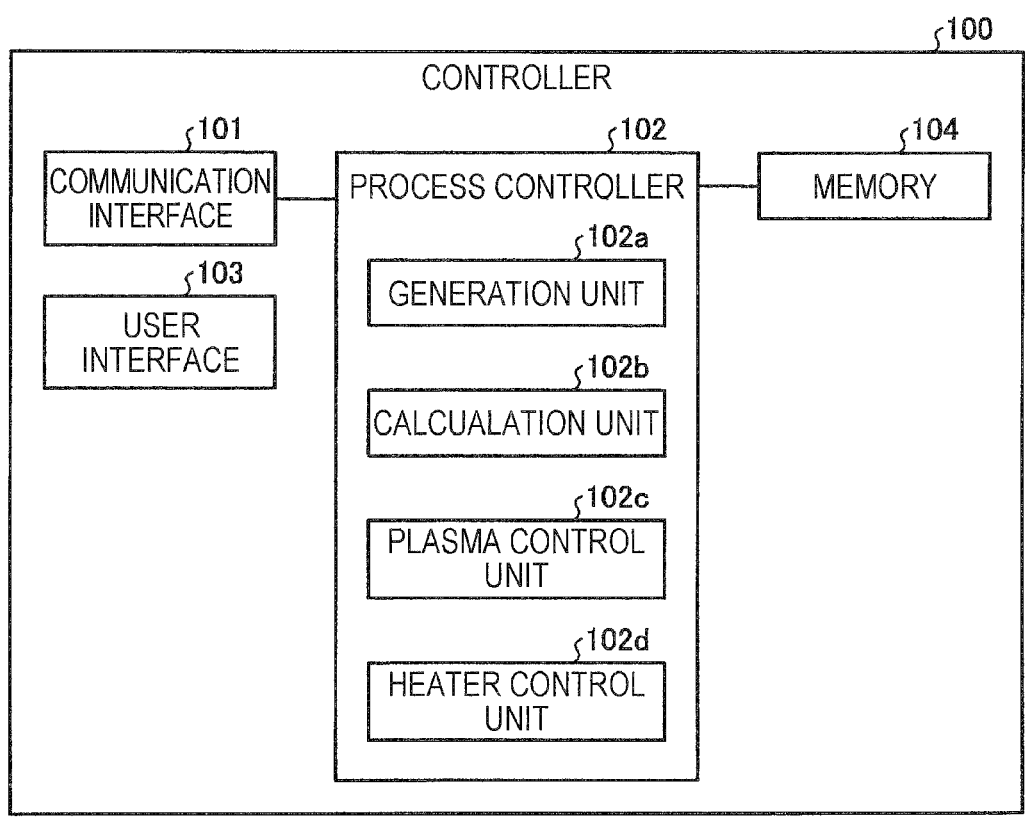
FIG. 4 is a block diagram illustrating a schematic configuration of a controller that controls the substrate processing apparatus according to the exemplary embodiment.

Next, the controller 100 will be described in detail. FIG. 4 is a block diagram illustrating a schematic configuration of a controller that controls the substrate processing apparatus according to the exemplary embodiment. The controller 100 includes a communication interface 101, a process controller 102, a user interface 103, and a memory 104.

The communication interface 101 is capable of communicating with the measurement apparatus 11 via the network N, and exchanges various data with the measurement apparatus 11. For example, the communication interface 101 receives the data of the CD transmitted from the measurement apparatus 11.

The process controller 102 has a central processing unit (CPU) and controls each part of the substrate processing apparatus 10.

The user interface 103 includes, for example, a keyboard for inputting commands by a process manager to manage the substrate processing apparatus 10, and a display for visually displaying the operation status of the substrate processing apparatus 10.

The memory 104 stores a control program (software) for implementing various processings performed in the substrate processing apparatus 10 by the control of the process controller 102, or recipe in which, for example, a processing condition data is stored. Further, the control program or the recipe of, for example, the processing condition data may be used in a state of being stored in a computer-readable computer storage medium (e.g., a hard disk, an optical disk such as a DVD, a flexible disk, or a semiconductor memory), or may be used on-line by being transmitted at any time from other devices, for example, through a dedicated line.

The process controller 102 has an internal memory for storing a program or data, reads the control program stored in the memory 104, and executes a processing of the read control program. The process controller 102 functions as various processing units by the operation of the control program. For example, the process controller 102 has functions of a generation unit 102a, a calculation unit 102b, a plasma control unit 102c, and a heater control unit 102d. In the substrate processing apparatus 10 according to the present exemplary embodiment, descriptions will be made on an exemplary case where the process controller 102 has the functions of the generation unit 102a, the calculation unit 102b, the plasma control unit 102c, and the heater control unit 102d. However, the functions of the generation unit 102a, the calculation unit 102b, the plasma control unit 102c, and the heater control unit 102d may be distributed in a plurality of controllers.

However, in substrate processing such as, for example, plasma etching, it is desired that the range of the CD (the difference between the maximum value of the CD and the minimum value of the CD) on the entire surface of the wafer W is small and the average value of the CD is close to a target value. Meanwhile, in the substrate processing, the progress of the processing varies depending on the temperature of the wafer W. For example, in plasma etching, the progressing speed of the etching varies depending on the temperature of the wafer W. Therefore, in the substrate processing apparatus 10 according to the present exemplary embodiment, the situation in which the range of the CD of the entire surface of the wafer W is smaller and the average value of the CD is close to the target value is implemented using a prediction model for predicting the critical dimension at a predetermined measurement point of the wafer W with the temperature of each heater HT as a parameter.

Here, the prediction model will be described. In the present exemplary embodiment, descriptions will be made on a prediction model in which the critical dimension of the measurement point is modeled by a linear function of the temperature of each heater HT.

In the vicinity of the boundary between adjacent divided regions among the respective divided regions, the temperature changes even due to the influence of adjacent divided regions. In consideration of the influence of the temperature of the heater HT in the adjacent divided region with respect to the measurement point, the temperature at each measurement point may be expressed by the following equation (1) with the temperature T of the heater HT as a parameter.

$$T_{i,j} = T_i + \delta T_{i,j} \quad (1)$$

Here, i is the number of a divided region provided with a heater HT and including a measurement point. j is the number of a measurement point included in a divided region provided with a heater HT. $T_i$ represents a temperature of the divided region of number i. $\delta T_{i,j}$ represents a temperature difference between the temperature of the measurement point j and $T_i$ in the divided region of number i. This temperature difference is caused by an influence of heat from adjacent divided regions. $\delta T_{i,j}$ also changes in accordance with the distance from the adjacent divided region of the measurement point.

Figure 5A:
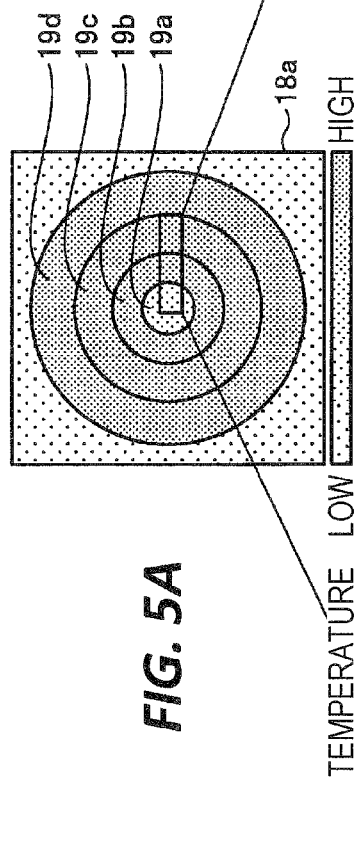
FIGS. 5A and 5B are views illustrating an example of a temperature distribution.
Figure 5B:
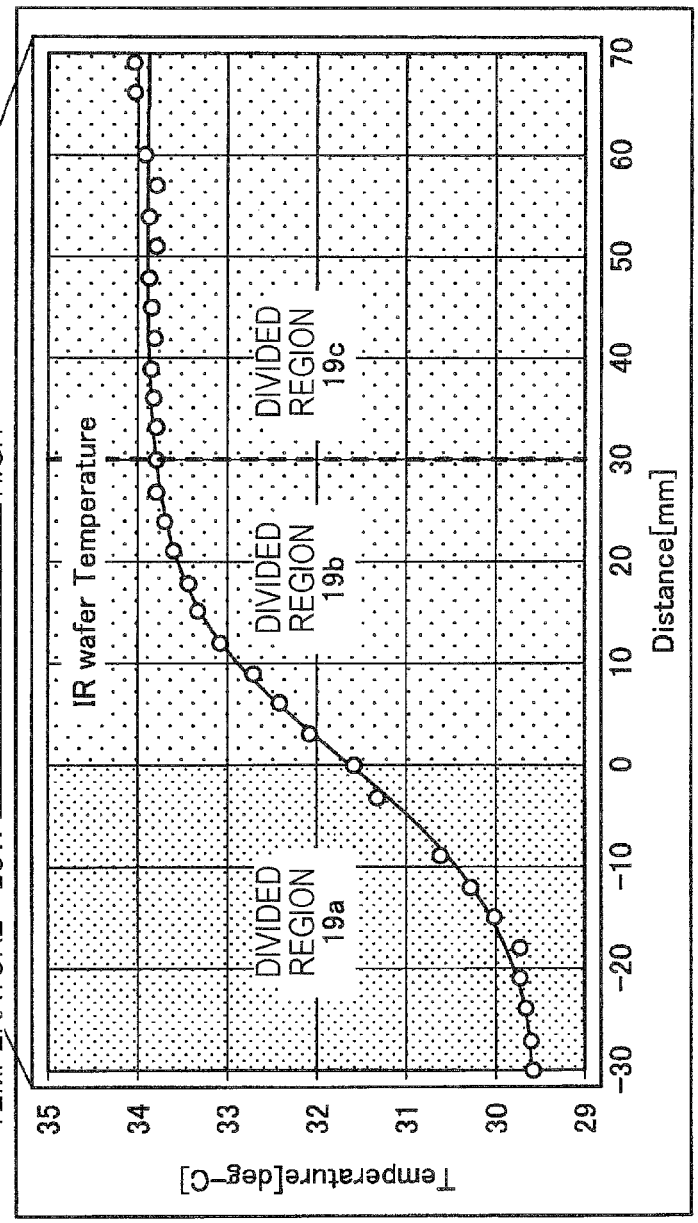

$\delta T_{i,j}$ is obtained as follows. The temperature distribution of the divided regions is measured by infrared thermography in a state where the temperatures of the heaters HT of the two adjacent divided regions are changed. The temperature distribution of the divided regions may be obtained at least once in advance. Further, it is not necessary to measure the temperature distribution of the divided regions using the substrate processing apparatus 10, and the measurement may be performed using a placing table for measurement having the same configuration as that of the placing table 16. For example, the measurement may be performed using a placing table for measurement using the same parts as those of the placing table 16. FIGS. 5A and 5B are views illustrating an example of the temperature distribution. In the placing table 16 illustrated in FIGS. 5A and 5B, the placement region 18a on which the wafer W is placed is divided into regions 19a, 19b, 19c, and 19d. FIG. 5A illustrates an infrared thermography image in the case where the temperature of the heater HT is changed between the inside divided region 19a and the divided regions 19b, 19c, and 19d. FIG. 5B illustrates a graph indicating the temperature change with respect to a distance d from the boundary, when assuming that the boundary of the divided regions 19a and 19b is zero. In the example of FIG. 5B, the temperature of the divided region 19a is 29.5° C., and the temperatures of the divided regions 19b and 19c are 34° C. As illustrated in FIG. 5B, the temperature of the divided region 19b in the vicinity of the boundary with the divided region 19a does not become 34° C. due to the influence of the divided region 19a, and the temperature also changes depending on the distance from the divided region 19a.

For example, when assuming that two adjacent divided regions 19 are divided regions 19-1 and 19-2, the temperature of the divided region 19-1 is T1-1, and the temperature of the divided region 19-2 is $T_{2-1}$, the temperature T at the position of the distance d from the boundary of the divided region 19-2 may be expressed by an approximate expression as in the following equation (2).

$$T = T_{2-1} + \delta T = T_{2-1} + (T_{1-1} - T_{2-1}) \cdot \frac{1}{1 + \exp\left(\frac{d}{\lambda}\right)} \quad (2)$$

Here, $\lambda$ is a constant for approximating a graph of the temperature change. For example, when approximating the graph of the temperature change in FIG. 5B, $\lambda$ is 7.2 mm.

When $\delta T_{i,j}$ is expressed by equation (2), equation (1) may be expressed by the following equation (3).

$$T_{i,j} = T_i + \delta T_{i,j} \quad (1)$$
$$= T_i + \sum_k (T_k - T_i) \frac{1}{1 + \exp\left(\frac{d_{i,j,k}}{\lambda_{i,j,k}}\right)}$$
$$= T_i \left\{ 1 - \sum_k \frac{1}{1 + e\left(\frac{d_{i,j,k}}{\lambda_{i,j,k}}\right)} \right\} + \sum_{k \,(k \neq i)} T_k \frac{1}{1 + \exp\left(\frac{d_{i,j,k}}{\lambda_{i,j,k}}\right)} \quad (3)$$

Here, k is the number of a divided region adjacent to the i-th divided region. $d_{i,j,k}$ is a distance from the k-th divided region adjacent to the j-th measurement point in the i-th divided region. Since the position of the measurement point is determined in advance, $d_{i,j,k}$ may be obtained in advance. $\lambda_{i,j,k}$ is a constant expressing the influence of the k-th divided region adjacent to the j-th measurement point in the i-th divided region. Assuming that the influence of adjacent divided regions is the same, $\lambda_{i,j,k}$ may be all the same value. For example, when using the measurement results in FIG. 5B, all the values of $\lambda_{i,j,k}$ are 7.2 mm.

Figure 6:
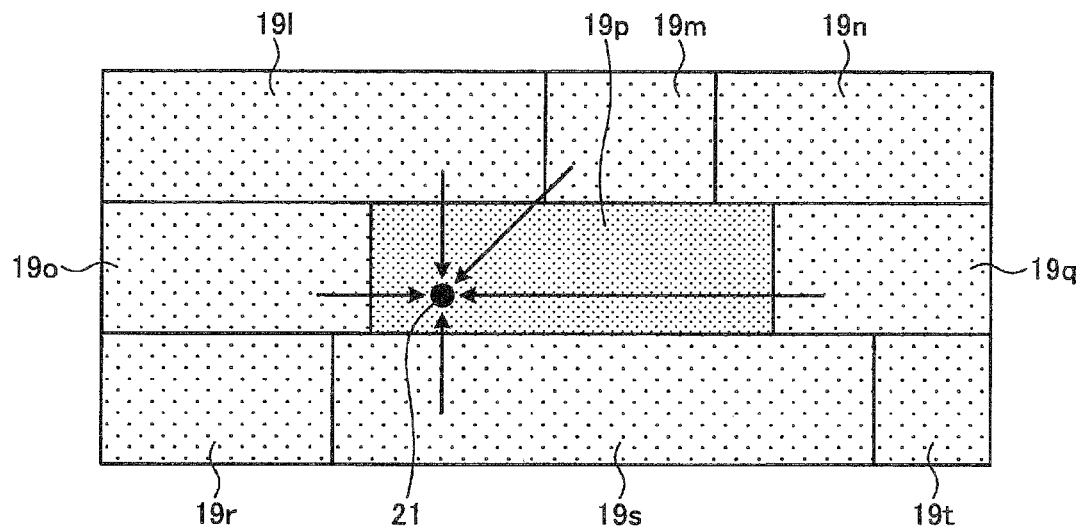
FIG. 6 is a view for explaining a relationship of divided regions.

FIG. 6 is a view for explaining a relationship of divided regions. In FIG. 6, divided regions 19l to 19t are illustrated. The divided region 19p is adjacent to the divided regions 19l to 19o and 19s. Further, a measurement point 21 is included in the divided region 19p. When the number of a divided region 19p is i, the numbers of the divided regions 19l to 19o and 19s are k. Further, $d_{i,j,k}$ are distances between the measurement point 21 and the divided regions 19l to 19o and 19s as indicated by arrows in FIG. 6.

Next, in order to obtain data used for generating the prediction model, the substrate processing apparatus 10 controls each heater HT to vary the temperature of each divided region in several levels and exchange the wafers W at each temperature, so that plasma etching actually performed on respective wafers W is individually performed thereon. For example, the substrate processing apparatus 10 controls each heater HT at three or more temperatures, exchanges the wafers W at each temperature, and individually performs the actually performed plasma etching. As an example, the substrate processing apparatus 10 performs plasma etching on the wafers W in the state where each heater HT is set to 50° C. Further, the substrate processing apparatus 10 d performs plasma etching on the wafers W in the state where each heater HT is set to 55° C. Further, the substrate processing apparatus 10 performs plasma etching on the wafers W in the state where each heater HT is set to 45° C. When obtaining data used for generating the prediction model, the temperature of each divided region is not necessarily common to all the divided regions. That is, some divided regions may have a temperature different from that of other divided regions. For example, the temperature may be different between a divided region near the center of the placement region 18a and a divided region near the outer periphery of the placement region 18a.

Each wafer W on which plasma etching has been performed at each temperature is conveyed to the measurement apparatus 11. The measurement apparatus 11 measures the CD at a measurement point with respect to each of the conveyed wafers W using a predetermined position as the measurement point. For example, the measurement apparatus 11 measures the CD at each measurement point on each wafer W on which the plasma etching has been performed, in the state where respective heaters HT are set to three temperatures of 45° C., 50° C., and 55° C. The measurement apparatus 11 transmits the data of the CD measured at each measurement point to the substrate processing apparatus 10.

When the CD of the measurement point is predicted by the linear function of the temperature T of each heater HT, the CD at each measurement point may be expressed by the following equation (4-1) with the temperature T of the heater HT as a parameter.

$$CD_{i,j} = A_{11\_i,j} \cdot (T_{i,j} - T_{i,j\_a}) + A_{10\_i,j} \quad (4\text{-}1)$$

Here, i is the number of a divided region provided with a heater HT and including a measurement point. For example, the number i is sequentially assigned to divided regions each of which is provided with a heater HT. j is the number of a measurement point included in a divided region provided with a heater HT. For example, the number j is sequentially assigned to the measurement points for respective divided regions each provided with a heater HT. $CD_{i,j}$ represents a value of the CD of the measurement point of number j included in the division region of number i. $T_i$ represents a temperature of the divided region of number i. $CD_{i,j}$ represents a temperature of the measurement point of number j of the division region of number i. $A_{11\_i,j}$ is a coefficient of a linear function for obtaining the value of the CD of the measurement point of the number j included in the divided region of the number i from the temperature $T_i$. $T_{i\_a}$ represents an average temperature of three or more temperatures of the divided region of number i at which the CD is measured. For example, when the CD is measured at three temperatures of 45° C., 50° C., and 55° C., $T_{i-a}$ is 50° C. $CD_{i,j}$ represents an average temperature of three or more temperatures obtained by measuring the CD of the measurement point of number j of the division region of number i. $A_{10\_i,j}$ represents an average value of the CD measured at three or more temperatures of the measurement point of number j included in the divided region of number i.

When equation (4-1) is expressed as equation (4-2), temperature $\tau_l$ is expressed by the following equation (5-2), and $a_{i,j,l}$ is expressed by the following equation (5-3), equation (5-1) may be expressed as follows.

$$CD_{i,j} = A_{11\_i,j} \cdot (T_{i,j} - T_{i,j\_a}) + A_{10\_i,j} \quad (4\text{-}1)$$

$$= A_{1L\_i,j} \cdot (T_i - T_{i\_a}) \cdot \left(1 - \sum_k \frac{1}{1+e^{\left(\frac{d_{i,j,k}}{\lambda_{i,j,k}}\right)}}\right) + \quad (4\text{-}2)$$

$$\sum_{\substack{k \\ (k \ne i)}} A_{1L\_i,j} \cdot (T_k - T_{k\_a}) \cdot \frac{1}{1+e^{\left(\frac{d_{i,j,k}}{\lambda_{i,j,k}}\right)}} + A_{10\_i,j}$$

$$= \sum_l a_{i,j,l} \cdot \tau_l + A_{10\_i,j} \quad (i = 1 \sim 37) \quad (5\text{-}1)$$

$$\tau_l = T_l - T_{l\_a} \quad (5\text{-}2)$$

$$a_{i,j,l} = \begin{cases} A_{1L\_i,j}\left\{1 - \sum_k \frac{1}{1+e^{\left(\frac{d_{i,j,k}}{\lambda_{i,j,k}}\right)}}\right\} & (l = i) \\ A_{1L\_i,j} \frac{1}{1+e^{\left(\frac{d_{i,j,k}}{\lambda_{i,j,k}}\right)}} & (l = k) \\ 0 & (\text{Others}) \end{cases} \quad (5\text{-}3)$$

Here, l is the number of a divided region provided with a heater HT. For example, when there are 20 divided regions each provided with a heater HT, l ranges from 1 to 20.

When generating the prediction model, the substrate processing apparatus 10 controls each heater HT to vary the temperature of each divided region in several levels and exchange the wafers W at each temperature, so that actually performed plasma etching is individually performed. For example, the substrate processing apparatus 10 controls each heater HT to three or more temperatures, exchanges the wafers W at the respective temperatures, and individually performs the actually performed plasma etching. As an example, the substrate processing apparatus 10 performs a plasma etching processing on the wafers W in the state where each heater HT is set to 50° C. Further, the substrate processing apparatus 10 performs a plasma etching processing on the wafers W in the state where each heater HT is set to 55° C. Further, the substrate processing apparatus 10 performs a plasma etching processing on the wafers W in the state where each heater HT is set to 45° C.

Ten, each wafer W subjected to the plasma etching processing at each temperature is moved to the measurement apparatus 11, and the CD of the measurement point is measured by the measurement apparatus 11 using the pre-determined position of the wafer W as a measurement point. That is, the measurement apparatus 11 measures the CD at each measurement point of each wafer W on which plasma etching has been performed, by setting each heater HT to three temperatures of 45° C., 50° C., and 55° C. The measurement apparatus 11 transmits the data of the CD measured at each measurement point to the substrate processing apparatus 10.

The generation unit 102a generates a prediction model from the received data of the CD. For example, the generation unit 102a performs fitting using the CD at each measurement point and the temperature of each heater HT based on the data of the CD of the measurement points of the respective wafers W subjected to the plasma etching processing, which is received from the measurement apparatus 11, in the state where the respective heaters HT are set to three temperatures of 45° C., 50° C., and 55° C., thereby obtaining the value of the coefficient $A_{11\text{-}i,j}$.

When the value of the coefficient $A_{11\text{-}i,j}$ is obtained, the coefficient $a_{i,j,l}$ is obtained from the above equation (5-3). Then, $CD_{i,j}$ may be calculated from the temperature $\tau_i$ using the above equation (5-1).

The generation unit 102a substitutes the value of the obtained coefficient $A_{11\text{-}i,j}$ into equation (5-3) to obtain the coefficient $a_{i,j,l}$, and generates, as a prediction model, equation (5-1) obtained by substituting the obtained coefficient $a_{i,j,l}$.

Using the prediction model generated by the generation unit 102a, the calculation unit 102b calculates a target temperature of the heater HT in each divided region in which the CD of the measurement point satisfies the predetermined condition. For example, the calculation unit 102b calculates the temperature of the heater HT in each divided region where the square sum of errors of the CD at the respective measurement points with respect to a target value p is minimized, using the prediction model.

A method of calculating the temperature of the heater HT in each divided region where the square sum of errors is minimized will be described in detail.

The above equation (5-1) may be expressed by the following equation (6).

$$CD_m = \sum_n a_{m,n} \cdot \tau_n + A_{10\_m} \quad (6)$$

Here, m is a number for identifying the measurement point. For example, when there are 400 measurement points, m ranges from 1 to 400. In equation (5-1), the number is sequentially assigned to the measurement points for each of the divided regions. However, in equation (6), the number m is sequentially assigned to the measurement points of all the divided regions. n is the number of a divided region provided with a heater HT. $CD_m$ corresponds to $CD_{i,j}$ and represents the CD of the measurement point of number m. $\tau_n$ corresponds to $\tau_l$ and represents the temperature of the heater HT of the divided region of number n. $a_{m,n}$ corresponds to $a_{i,j,l}$ and represents a coefficient. $A_{10\_m}$ corresponds to $A_{10\_i,j}$ and represents the average value of the CD measured at three or more temperatures of the measurement point of number m, respectively.

In substrate processing such as plasma etching, it is desirable that the range of the CD on the entire surface of the wafer W is small and the average value of the CD is close to the target value set as the target dimension. Therefore, for all the measurement points, the temperature of the heater HT in each divided region where $CD_m$ is substantially the target value ρ ($CD_m \approx \mu$) is assumed as $T^*_n$. From the above equation (5-2), $\tau^*_n$ has a relationship of the following equation (7).

$$\tau^*_n = T^*_n - T_{n\_a} \qquad (7)$$

The CD at each measurement point may have an error with respect to the target value μ due to, for example, a variation in CD at each measurement point prior to the substrate processing or influence of the substrate processing. Therefore, when the temperature of the heater HT in each divided region is $\mu^*_n$, the $CD_m$ at each measurement point may be expressed by the following equation (8).

$$\mu + \varepsilon_m = \sum_n a_{m,n} \cdot \tau^*_n + A_{10\_m} \qquad (8)$$

Here, $\varepsilon_m$ is an error of the CD with respect to the target value μ at the measurement point of number m.

From equation (8), the square sum of errors at the respective measurement point may be expressed by the following equation (9).

$$\sum_m \varepsilon_m^2 = \sum_m \left\{ \sum_m a_{m,n} \cdot \tau^*_n + A_{10\_m} - \mu \right\}^2 \qquad (9)$$

The point at which the square sum of errors expressed by equation (9) is minimized is a point where the minimum value is obtained. At the minimum value, equation (9) satisfies equations (10-1) to (10-2).

$$\frac{\partial}{\partial \tau^*_l} \sum_m \varepsilon_m^2 = \sum_m 2 a_{m,l} \left\{ \sum_n a_{m,n} \cdot \tau^*_n + A_{10\_m} - \mu \right\} = 0 \qquad (10\text{-}1)$$

$$\sum_n \tau^*_n \cdot \sum_m a_{m,l} \cdot a_{m,n} = \sum_m a_{m,l}(\mu - A_{10\_m}) \qquad (10\text{-}2)$$

When $x_{l,n}$ is represented by equation (11-2) and $y_l$ is represented by equation (11-3), equation (10-2) may be expressed by the following equation (11-1). For example, when there are 400 measurement points, equations (11-2) and (11-3) are used to obtain the total sum with m ranging from 1 to 400.

$$\sum_n x_{l,n} \cdot \tau^*_n = y_l \qquad (11\text{-}1)$$

$$x_{l,n} = \sum_m a_{m,l} \cdot a_{m,n} \qquad (11\text{-}2)$$

$$y_l = \sum_m a_{m,l}(\mu - A_{10\_m}) \qquad (11\text{-}3)$$

Here, l is the number of a divided region provided with a heater HT. For example, when there are 20 divided regions each provided with the heater HT, l ranges from 1 to 20.

Equation (11-1) may be expressed as a matrix calculation of the following equation (12).

$$\begin{bmatrix} x_{1,1} & x_{1,2} & \cdots & x_{1,37} \\ x_{2,1} & x_{2,2} & \cdots & x_{2,37} \\ \vdots & & & \vdots \\ x_{37,1} & x_{37,2} & \cdots & x_{37,37} \end{bmatrix} \begin{bmatrix} \tau^*_1 \\ \tau^*_2 \\ \vdots \\ \tau^*_{37} \end{bmatrix} = \begin{bmatrix} y_1 \\ y_2 \\ \vdots \\ y_{37} \end{bmatrix} \qquad (12)$$

The matrix represented in equation (12) may be transformed into a matrix of the following equation (13) by obtaining the inverse matrix.

$$\begin{bmatrix} \tau^*_1 \\ \tau^*_2 \\ \vdots \\ \tau^*_{37} \end{bmatrix} = \begin{bmatrix} x_{1,1} & \cdots & x_{1,37} \\ \vdots & & \vdots \\ x_{37,1} & \cdots & x_{37,37} \end{bmatrix}^{-1} \begin{bmatrix} y_1 \\ \vdots \\ y_{37} \end{bmatrix} \qquad (13)$$

$x_{l,n}$ of the matrix may be calculated by substituting $a_{i,j,l}$ corresponding to $a_{m,l}$ and $a_{m,l}$ into equation (11-2). $y_l$ of the matrix may also be calculated by substituting $a_{i,j,l}$ corresponding to $a_{m,l}$ and $A_{10-i,j}$ corresponding to $A_{10-m}$ into equation (11-3).

The calculation unit 102b calculates the temperature $\tau^*_n$ of the heater HT in each divided region where the square sum of errors is minimized, by solving the matrix of equation (13).

Figure 7:
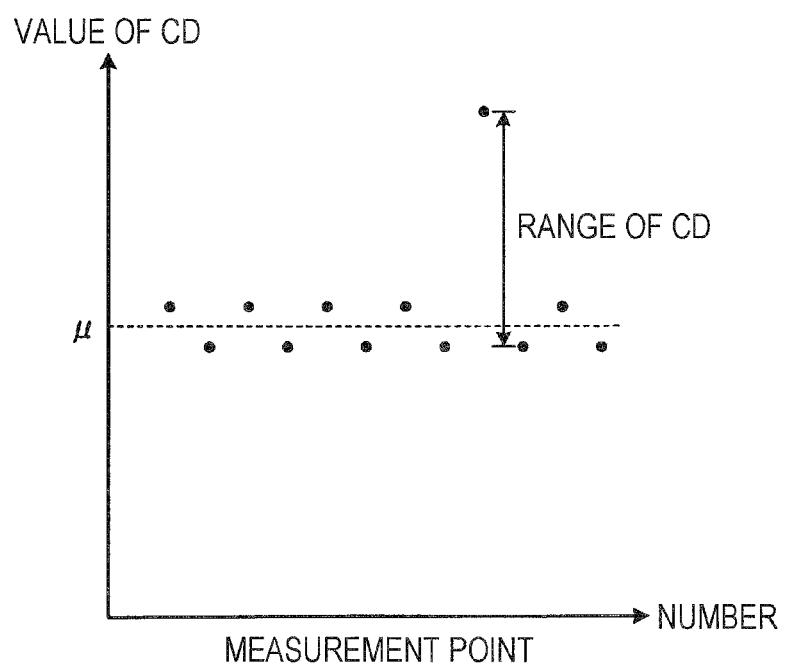
FIG. 7 is a diagram for explaining an example of the relationship between the square sum of errors and the range of CD.

However, even though the square sum of errors is minimized, the range of the CD may not be reduced in some cases. FIG. 7 is a diagram for explaining an example of the relationship between the square sum of errors and the range. The horizontal axis of FIG. 7 is the number of a measurement point. The vertical axis in FIG. 7 is the CD at a measurement point. The error at each measurement point is a difference between the target value p and the CD. When the square sum of errors is minimized, it suffices that the error at each measurement point becomes small as a whole. For this reason, for example, as illustrated in FIG. 7, when an error at one measurement point is large with respect to the target value p, but errors at a number of other measurement points is small with respect to the target value p, the sum becomes smaller. Meanwhile, the range of the CD is a difference between the maximum value of the CD and the minimum value of the CD. In the example of FIG. 7, the range of the CD is not small.

However, there is a strong positive correlation between the range of the CD and the error dispersion. It is considered that the temperature of the heater HT in each divided region where the range of the CD is minimized is in the vicinity of the temperature $\tau^*_n$ of the heater HT in each divided region where the square sum of errors is minimized.

Therefore, the calculation unit 102b calculates the CD of the heater HT in each divided region where the range is minimized, by changing the temperature $T_n$ of the heater HT in each divided region based on the temperature $\tau^*_n$ of the heater HT in each divided region where the square sum of errors is minimized. For example, the calculation unit 102b calculates the CD at each measurement point by individually changing, i.e., increasing or decreasing the temperature of the heater HT by a predetermined temperature based on the temperature $\tau^*_n$ of the heater HT in each divided region, and specifies the combination of the temperatures of the heaters HT in the respective divided regions where the range of the CD is minimized. The predetermined temperature may be a fixed value, may vary depending on the processing conditions, or may be settable from an external device. In the present exemplary embodiment, the predetermined temperature is set to 1 degree. For example, the calculation unit 102b calculates the target temperature of the heater HT in each divided region where the range of the CD is minimized, by setting, as an initial value, a value obtained by individually adding a random number to the temperature of the heater HT in each divided region, with respect to the combination of the temperatures of the heater HT in each of the specified divided regions, for example by using a generalized reduced gradient (GRG) method. The calculation unit 102b may calculate the target temperature of the heater HT in each divided region where the range of the CD is minimized, by repeatedly calculating the CD at each measurement point by changing the temperature of the heater HT in each divided region with a temperature width smaller than a predetermined temperature, at random or by a predetermined rule, with respect to the combination of the temperatures of the heater HT in each of the specified divided regions.

The plasma control unit 102c controls each part of the substrate processing apparatus 10 and controls the plasma processing. For example, the plasma control unit 102c reads, for example, a recipe corresponding to the plasma etching to be performed from the memory 104, and controls each part of the substrate processing apparatus 10 based on the read recipe.

Under the control of the plasma control unit 102c, the heater control unit 102d performs a control such that the heater HT in each divided region becomes the target temperature calculated by the calculation unit 102b when the plasma etching is performed on the wafer W placed on the placement region 18a of the placing table 16. For example, the heater control unit 102d controls the heater power source HP such that each heater HT is supplied with power in accordance with each target temperature.

The wafer W on which plasma etching has been performed is conveyed to the measurement apparatus 11. The measurement apparatus 11 measures the CD of the measurement point of the conveyed wafer W and transmits the data of the measured CD to the substrate processing apparatus 10.

The calculation unit 102b determines from the data of the CD received from the measurement apparatus 11 whether the range of the CD is within the allowable range, and when the range of the CD is not within the allowable range, corrects the prediction model. For example, the calculation unit 102b calculates again the temperature $\tau^*_n$ of the heater HT in each divided region by adding the value of the CD-target value p at each measurement point to the function of each measurement point of each prediction model. Then, the calculation unit 102b calculates the CD of the heater HT in each divided region where the range is minimized, by changing the temperature $T_n$ of the heater HT in each divided region based on the temperature $\tau^*_n$ of the heater HT in each divided region where the square sum of errors is minimized. In the substrate processing apparatus 10 according to the present exemplary embodiment, as a result of performing the plasma etching on the wafer W at the calculated target temperature of the heater HT in each divided region, the prediction model is regenerated when the range of the CD at the measurement point of the wafer W does not fall within the allowable value.

[Flow of Temperature Control]

Figure 8A:
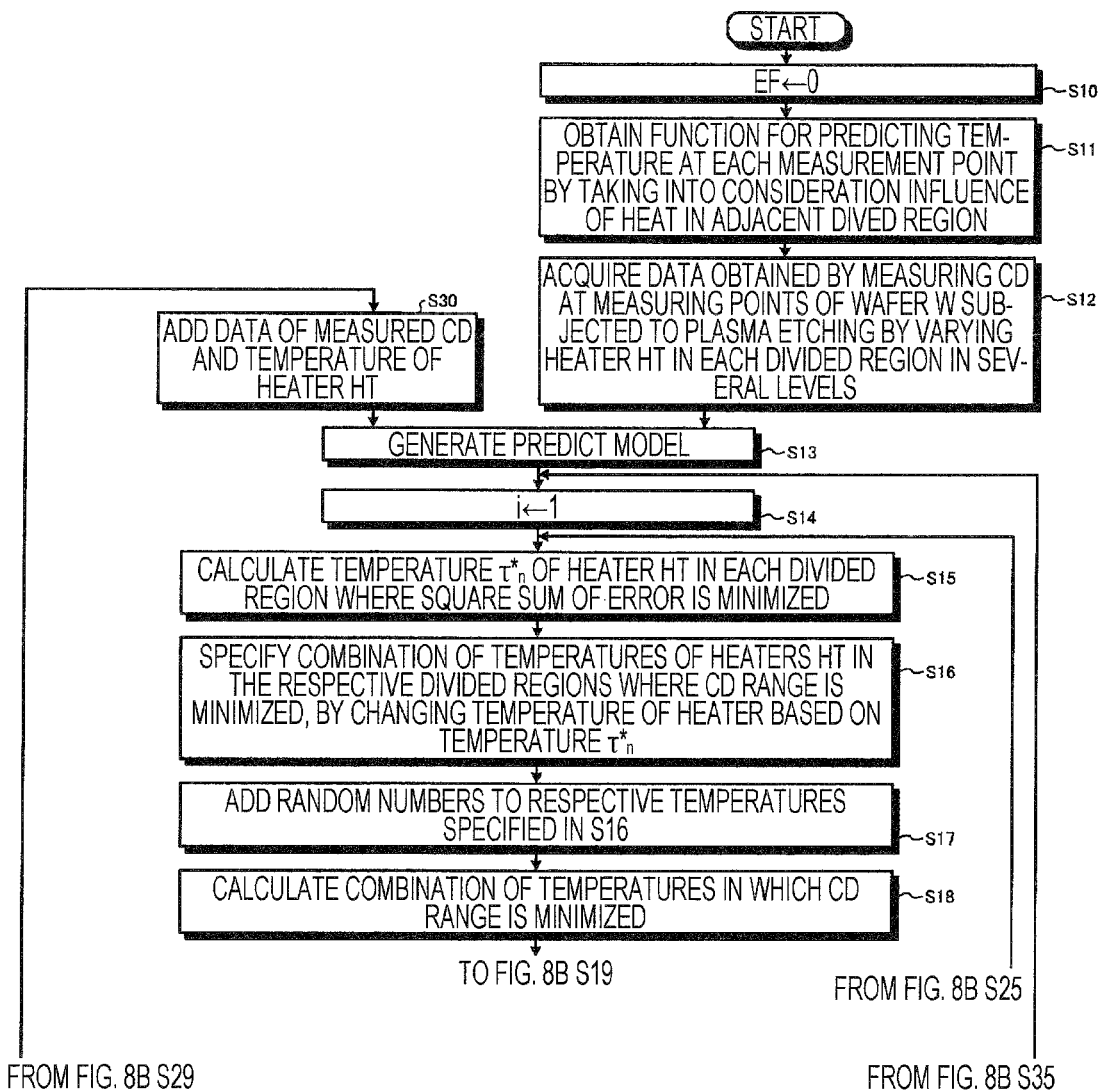
FIGS. 8A and 8B are flowcharts illustrating an example of the flow of a temperature control method according to a first exemplary embodiment.
Figure 8B:
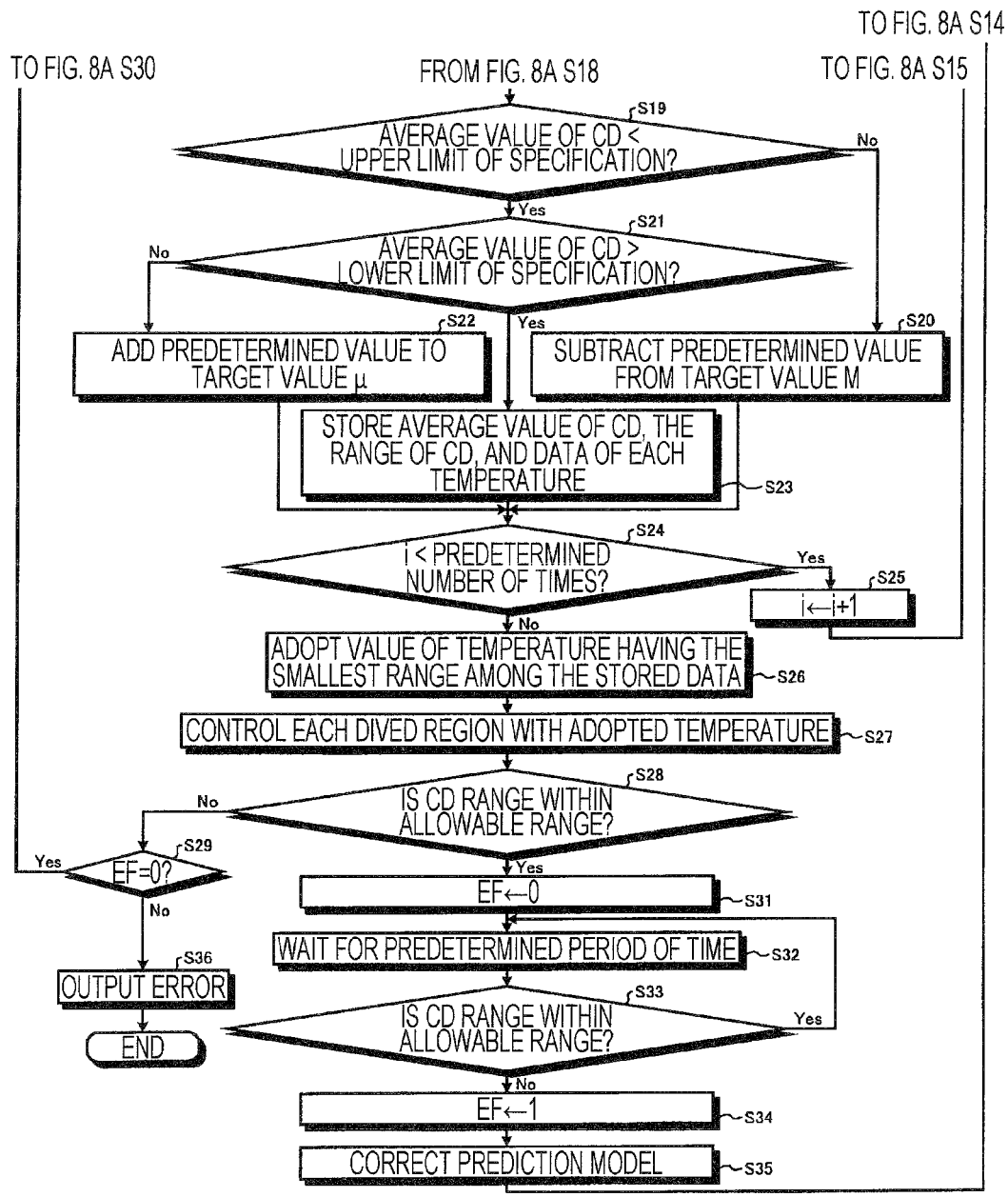

Next, descriptions will be made on a temperature control method using the substrate processing apparatus 10 according to a first exemplary embodiment. FIGS. 8A and 8B are flowcharts illustrating an example of the flow of the temperature control method according to the first exemplary embodiment.

The generation unit 102a initializes the error flag EF to zero (0) (step S10). The generation unit 102a obtains a function for predicting the temperature of the measurement point using the temperature of each heater HT as a parameter and taking into consideration an influence of the temperature of the heater HT in an adjacent divided region according to the distance between the measurement point and the divided region adjacent to the divided region including the measurement point (step S1). In the present exemplary embodiment, the generation unit 102a obtains a function for predicting the CD of the measurement point by a linear function of the temperature T of each heater HT. For example, the generation unit 102a obtains equations (5-1), (5-2), and (5-3).

The generation unit 102a acquires data obtained by measuring the CD at the measurement points of the wafer W subjected to the plasma etching by varying the heater HT in each divided region in several levels (step S12). For example, the substrate processing apparatus 10 controls each heater HT to vary the temperature of each divided region in several levels and exchange the wafers W at each temperature, so that the actually performed plasma etching is individually performed. Each wafer W subjected to the plasma etching processing at each temperature is moved to the measurement apparatus 11, and the CD of the measurement point is measured by the measurement apparatus 11 with the predetermined position of the wafer W as a measurement point. The measurement apparatus 11 transmits the data of the CD measured at each measurement point to the substrate processing apparatus 10. The generation unit 102a receives the data of the CD of the respective measurement points measured from the measurement apparatus 11 and acquires data obtained by measuring the CD at the measurement points of the wafers W subjected to the plasma etching by varying the heater HT in each divided region in several levels.

The generation unit 102a generates a prediction model from the acquired data (step S13). For example, the generation unit 102a performs fitting using the measured CD and the temperature of each heater HT at each measured point, thereby obtaining a function for predicting the CD of the measuring point from the temperature of each heater HT as a prediction model.

The calculation unit 102b initializes the counter i to 1 (step S14). Then, using the generated prediction model, the calculation unit 102b calculates the temperature $\tau^*_n$ of the heater HT in each divided region where the square sum of errors of the CD at each measurement point with respect to the target value μ is minimized (step S15).

The calculation unit 102b calculates the CD at each measurement point by individually changing, i.e., increasing or decreasing the temperature of the heater HT by a predetermined temperature (e.g., 1 degree) based on the temperature $\tau^*_n$ of the heater HT in each divided region, and specifies the combination of the temperatures of the heaters HT in the respective divided regions where the range of the CD is minimized (step S16).

The calculation unit 102b obtains random numbers separately for the temperatures of the heaters HT in the specified divided regions and adds the random numbers thereto (step S17). The calculation unit 102b calculates the temperature of the heater HT in each divided region where the range of the CD is minimized, for example, according to the GRG method using as an initial value the value obtained by adding the random number (step S18).

The calculation unit 102b obtains an average value of the CD at each measurement point when the heater HT in each divided region is set to the calculated temperature, and determines whether the average value of the CD is less than the upper limit of the required specification (step S19). When the average value of the CD is not less than the upper limit of the required specification (step S19: No), the calculation unit 102b subtracts a predetermined value from the target value p (step S20).

Meanwhile, when the average value of the CD is less than the upper limit of the required specification (step S19: Yes), the calculation unit 102b determines whether the average value of the CD is larger than the lower limit of the required specification (step S21). When the average value of the CD is equal to or less than the lower limit of the required specification (step S21: No), the calculation unit 102b adds a predetermined value to the target value p (step S22).

Meanwhile, when the average value of the CD is larger than the lower limit of the required specification (step S21: Yes), the calculation unit 102b stores the average value of the CD, the range of the CD, and the data of the temperature of the heater HT in each divided region (step S23).

The calculation unit 102b determines whether or not the counter i is smaller than a predetermined processing number of times N (step S24). When the counter i is smaller than the predetermined processing number of times N (step S24: Yes), the calculation unit 102b adds 1 to the counter i (step S25), and proceeds to the above-described step S15.

When the counter i is equal to or larger than the predetermined processing number of times N (step S24: No), the calculation unit 102b adopts, as the target temperature, the temperature of the heater HT in each divided region of the data having the smallest range of the CD among the stored data (step S26).

When the plasma etching is performed on the wafer W placed on the placement region 18a of the placing table 16, the heater control unit 102d controls the temperature to be the target temperature adopted by the heater HT in each divided region (step S27).

The wafer W on which plasma etching has been performed is conveyed to the measurement apparatus 11. The measurement apparatus 11 measures the CD of a measurement point of the conveyed wafer W and transmits the data of the measured CD to the substrate processing apparatus 10.

The calculation unit 102b determines, from the data of the CD received from the measurement apparatus 11, whether the range of the CD falls within the allowable range (step S28). When the range of the CD does not fall within the allowable range (step S28: No), the calculation unit 102b determines whether the error flag EF is 0 (step S29). When the error flag EF is 0 (step S29: Yes), the generation unit 102a adds the data of the measured CD and the temperature of the heater HT as data for generating the prediction model (step S30), and proceeds again to step S13 to regenerate the prediction model from the data of the measured CD and the temperature of the heater HT and the data acquired in step S12.

Meanwhile, when the range of the CD falls within the allowable range (step S28: Yes), the calculation unit 102b initializes the error flag EF to 0 (step S31). Then, the calculation unit 102b waits for the process for a predetermined period of time (step S32). The predetermined period of time may be, for example, a period during which the plasma etching of a predetermined number of wafers W is performed or may be a period during which a predetermined time has passed.

The substrate processing apparatus 10 performs the plasma etching of the wafer W by controlling the temperature of the wafer W to be the target temperature adopted by the heater HT in each divided region for a predetermined period of time.

After the predetermined period of time, the calculation unit 102b determines from the data of the CD received from the measurement apparatus 11 whether the range of the CD falls within the allowable range (step S33). When the range of the CD falls within the allowable range (step S33: Yes), the process returns to step S32 to wait for the predetermined period of time.

Meanwhile, when the range of the CD does not fall within the allowable range (step S33: Yes), the calculation unit 102b sets 1 to the error flag EF (step S34). The calculation unit 102b performs a correction on the prediction model (step S35). For example, the calculation unit 102b performs a correction by adding the CD-target value p at each measurement point to the function of each measurement point of each prediction model. Then, the calculation unit 102b proceeds to step S14 again to calculate the target temperature again.

Meanwhile, when the error flag EF is not 0 (step S29: No), the range of the CD does not fall within the allowable range even in the corrected prediction model. In this case, since the generation unit 102a is unable to generate an appropriate prediction model from the acquired data, the generation unit 102a outputs an error (step S36) and ends the process. For example, the generation unit 102a outputs a message to the user interface 103 that the data of the measurement point of the wafer W subjected to the plasma etching is to be acquired again by varying the heater HT in each divided region in several levels, and ends the process.

When an error is output, the process manager controls each heater HT of the substrate processing apparatus 10 to vary the temperature of each divided region in several levels, exchanges the wafers W at each temperature, individually performs the plasma etching to be actually performed, again acquires the data for generating the prediction model, and then, performs a temperature control method according to the present exemplary embodiment.

As described above, the substrate processing apparatus 10 according to the first exemplary embodiment calculates a target temperature of the heater HT in each divided region in which a CD at a predetermined measurement point of the wafer W when the plasma etching is performed on the wafer W placed on the placement surface satisfies a predetermined condition, using a prediction model that predicts the CD of the measurement point by using a temperature of the heater HT in each divided region as a parameter and taking into consideration an influence of a temperature of the heater HT in a divided region adjacent to a divided region including the measurement point in accordance with a distance between the measurement point and the adjacent divided region. When the plasma etching is performed on the wafer W placed on the placement surface, the substrate processing apparatus 10 controls such that the heater HT in each divided region reaches the target temperature. Therefore, the substrate processing apparatus 10 may control the temperature of the heater HT in each divided region such that the CD at the measurement point of the wafer W satisfies the predetermined condition.

Further, the substrate processing apparatus 10 according to the first exemplary embodiment calculates the temperature of the heater HT in each divided region where the square sum of errors of the CD at each measurement point with respect to a target value is minimized, using the prediction model. The substrate processing apparatus 10 calculates the target temperature of each divided region where the difference between the maximum value and the minimum value of the CD at each measurement point is minimized, by changing the temperature of the heater HT in each divided region based on the calculated temperature of each divided region. Therefore, the substrate processing apparatus 10 may accurately calculate the temperature of the heater HT at which the CD uniformity of the wafer W increases.

Further, the substrate processing apparatus 10 according to the first exemplary embodiment generates the prediction model from data obtained by measuring the CD of the measurement point when the plasma etching is performed on the wafer W by controlling the heater HT in each divided region to three or more temperatures. Using the generated prediction model, the substrate processing apparatus 10 calculates a target temperature of the heater HT in each divided region in which the CD of the measurement point satisfies the predetermined condition. Therefore, the substrate processing apparatus 10 may generate a prediction model capable of accurately predicting the CD at the measurement point.

Second Exemplary Embodiment

Next, a second exemplary embodiment will be described. Since the substrate processing system 1 and the substrate processing apparatus 10 according to the second exemplary embodiment have the same configuration as those of the substrate processing system 1 and the substrate processing apparatus 10 according to the first exemplary embodiment illustrated in FIG. 1, descriptions thereof will be omitted.

Next, a prediction model according to the second exemplary embodiment will be described. The temperature T of each heater HT and the CD of the measurement point have a relationship of the following equation (14).

$$\frac{d}{dt} CD = A' \cdot \exp\left(\frac{B'}{T}\right) \tag{14}$$

Here, A' is a coefficient of an exponential function of a reciprocal of an absolute temperature of the heater. B' is an activation energy, and in the case of the CD, it is as large as a physical adsorption energy. Specifically, B'≈0.25 [eV]× 1.7E4 [K/eV]=about 4.3E3K.

The CD may be expressed by the following equations (14) and (15).

$$CD = A' \cdot t \cdot \exp\left(\frac{B'}{T}\right) + CD_0 \tag{15}$$

Here, $CD_0$ is a constant term of the CD.

When the temperature T is expressed by a difference τ from the average temperature $T_a$ of three or more temperatures at which the CD is measured as in the following equation (16-1), exp(B'/T) in equation (15) may be expressed by the following equation (16-2).

$$\tau \equiv T - T_a \tag{16-1}$$

$$\exp\left(\frac{B'}{T}\right) = \exp\left(\frac{B'}{T_a + \tau}\right) \tag{16-2}$$

Equation (16-2) may be expressed by the following equation (17-1) when x is expressed as in the following equation (17-2).

$$\exp\left(\frac{B'}{T}\right) = \exp\left(\frac{B'}{T_a + \tau}\right) \tag{16-2}$$

$$= \exp\left(\frac{B'}{T_a\left(1 + \frac{\tau}{T_a}\right)}\right)$$

$$= \exp\left\{\frac{B'}{T_a} \cdot \left(1 + \frac{\tau}{T_a}\right)^{-1}\right\}$$

$$= \exp\left\{\frac{B'}{T_a}\left(1 - x + \frac{1}{2}x^2 + \ldots\right)\right\} \tag{17-1}$$

$$x \equiv \frac{\tau}{T_a} \ll 1 \tag{17-2}$$

Equation (17-1) may be approximated as in the following equation (18-1), and may be expressed by equation (18-2).

$$\exp\left(\frac{B'}{T_a}\right) = \exp\left\{\frac{B'}{T_a}\left(1 - x + \frac{1}{2}x^2 + \ldots\right)\right\} \tag{17-1}$$

$$\approx \exp\left\{\frac{B'}{T_a}(1 - x)\right\} \tag{18-1}$$

$$= \exp\left(\frac{B'}{T_a}\right) \cdot \left\{1 - \left(\frac{B'}{T_a}x\right) + \frac{1}{2}\left(\frac{B'}{T_a}x\right)^2 - \frac{1}{6}\left(\frac{B'}{T_a}x\right)^3 + \ldots\right\} \tag{18-2}$$

For example, when the average temperature $T_a$=300 K and τ=10 K, for example, the first-order term of x in the equation (18-2) is 0.47, and the second-order term is 0.11, the third-order term is 0.02. Thus, as the order of x is higher, the value is smaller.

For example, when equation (18-2) is approximated to the second-order term of x, it may be expressed by the following equation (19).

$$\exp\left(\frac{B'}{T_a}\right) \approx \exp\left(\frac{B'}{T_a}\right) \cdot \left\{1 - \left(\frac{B'}{T_a}x\right) + \frac{1}{2}\left(\frac{B'}{T_a}x\right)^2\right\} \tag{19}$$

Therefore, when equation (19) is used for exp(B'/T), equation (15) may be expressed by the following equation (20).

$$CD = A' \cdot t \cdot \exp\left(\frac{B'}{T_a}\right)\left\{1 - \left(\frac{B'}{T_a}x\right) + \frac{1}{2}\left(\frac{B'}{T_a}x\right)^2\right\} + CD_0 \tag{20}$$

When more precision is required, it is also possible to approximate by using exp(B'/T) to a term higher than the second order of the equation (18-2). Further, as exp(B'/T), an exponential function may be used as it is.

Equation (20) may be expressed by the following equation (21-1) when $A_{20}$ is expressed by the following equation (21-2), $A_{21}$ is expressed by the following equation (21-3), and $A_{22}$ is expressed by the following equation (21-4).

$$CD \equiv A_{20} + A_{21} \cdot \tau + A_{22} \cdot \tau^2 \qquad (21\text{-}1)$$

$$A_{20} \equiv A' \cdot t \cdot \exp\left(\frac{B'}{T_a}\right) + CD_0 \qquad (21\text{-}2)$$

$$A_{21} \equiv -A' \cdot t \cdot \exp\left(\frac{B'}{T_a}\right)\left(\frac{B'}{T_a}\right)\frac{1}{Ta} \qquad (21\text{-}3)$$

$$A_{22} \equiv A' \cdot t \cdot \exp\left(\frac{B'}{T_a}\right) \cdot \frac{1}{2}\left(\frac{B'}{T_a} \cdot \frac{1}{T_a}\right)^2 \qquad (21\text{-}4)$$

As expressed in equation (21-1), the CD may be approximated by a quadric function of $\tau$ near the average temperature $T_a$.

Equation (21-1) may be expressed by the following equation (22) when it is expressed as an equation of $CD_{i,j}$ at each measurement point in each divided region provided with the heater HT.

$$CD_{i,j} = A_{20\_i,j} + A_{21\_i,j} \tau_{i,j} + A_{22\_i,j}(\tau_{i,j})^2 \qquad (22)$$

Here, i is the number of a divided region provided with a heater HT and including a measurement point. j is the number of a measurement point included in each divided region provided with a heater HT.

The generation unit 102a generates a first prediction model in which the CD of the measurement point is modeled by the linear function of the temperature of the heater HT from the received data of the CD. For example, similarly to the first exemplary embodiment, the generation unit 102a performs fitting using the CD at each measurement point and the temperature of each heater HT based on the data of the CD of the measurement points of the respective wafers W subjected to the plasma etching processing, which is received from the measurement apparatus 11, with the respective heaters HT set to three temperatures of 45° C., 50° C., and 55° C., thereby obtaining a function that predicts the CD of the measurement point by a linear function of the temperature T of each heater HT as the first prediction model. For example, the generation unit 102a obtains equations (5-1), (5-2), and (5-3) as the first prediction model.

Further, the generation unit 102a generates a second prediction model in which the CD of the measurement point is modeled by a function of a second order or higher of the temperature of the heater HT, or a sum of an exponential function of reciprocal of the absolute temperature of the heater and a constant from the received data of the CD. For example, the generation unit 102a performs fitting using the CD at each measurement point and the temperature of each heater HT based on the data of the CD of the measurement points of the respective wafers W subjected to the plasma etching processing, which is received from the measurement apparatus 11, with the respective heaters HT set to three temperatures of 45° C., 50° C., and 55° C., thereby obtaining the value of the coefficients $A_{20\text{-}i,j}$, $A_{21\text{-}i,j}$, and $A_{22\text{-}i,j}$.

When the coefficients $A_{20\text{-}i,j}$, $A_{21\text{-}i,j}$, and $A_{22\text{-}i,j}$ are obtained, CD, at the temperature $T_1$ may be calculated from the above equations (16-1) and (22).

When more precision is required, the generation unit 102a may generate the second prediction model by performing fitting using the equation approximated using exp(B'/T) to a term higher than the second order of equation (18-2). Further, the generation unit 102a may generate the second prediction model by performing fitting using the exponential function as exp(B'/T) as it is.

Using the first and second prediction models generated by the generation unit 102a, the calculation unit 102b calculates a target temperature of the heater HT in each divided region in which the CD of the measurement point satisfies the predetermined condition. For example, similarly to the first exemplary embodiment, using the first prediction model, the calculation unit 102b calculates the temperature $\tau^*_n$ of the heater HT in each divided region where the square sum of errors of the CD at each measurement point with respect to the target value p is minimized.

Then, using the second prediction model, the calculation unit 102b calculates the target temperature of the heater in each divided region where the difference between the maximum value and the minimum value of the critical dimension at each measurement point is minimized, by changing the temperature of the heater HT in each divided region based on the calculated temperature of the heater HT in each divided region. For example, using the above equations (3) and (22), the calculation unit 102b calculates the CD of the heater HT in each divided region where the range is minimized, by changing the temperature $T_n$ of the heater HT in each divided region based on the temperature $\tau^*_n$ of the heater HT in each divided region where the square sum of errors is minimized. For example, the calculation unit 102b calculates the CD at each measurement point by individually changing, i.e., increasing or decreasing the temperature of the heater HT by a predetermined temperature based on the temperature $\tau^*_n$ of the heater HT in each divided region, and specifies the combination of the temperatures of the heaters HT in the respective divided regions where the range of the CD is minimized. Then, the calculation unit 102b calculates the target temperature of the heater HT in each divided region where the range of the CD is minimized, by setting as an initial value a value obtained by individually adding a random number to the temperature of the heater HT in each divided region, with respect to the combination of the temperatures of the heater HT in each of the specified divided regions, for example by using the GRG method. The calculation unit 102b may calculate the target temperature of the heater HT in each divided region where the range of the CD is minimized, by repeatedly calculating the CD at each measurement point by changing the temperature of the heater HT in each divided region with a temperature width smaller than a predetermined temperature, at random or by a predetermined rule, with respect to the combination of the temperatures of the heater HT in each of the specified divided regions.

[Flow of Temperature Control]

Figure 9A:
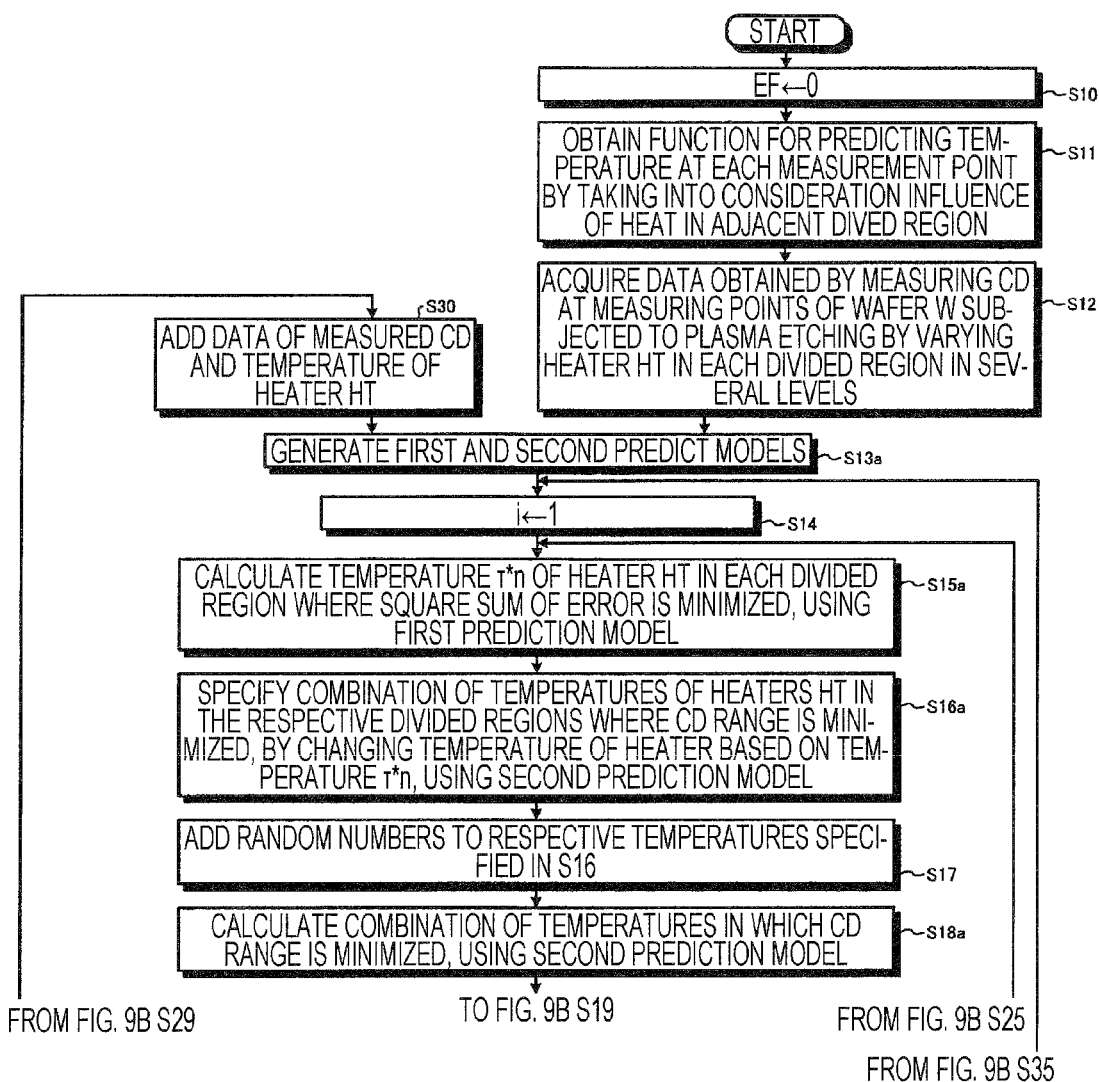
FIGS. 9A and 9B are flowcharts illustrating an example of the flow of a temperature control method according to a second exemplary embodiment.
Figure 9B:
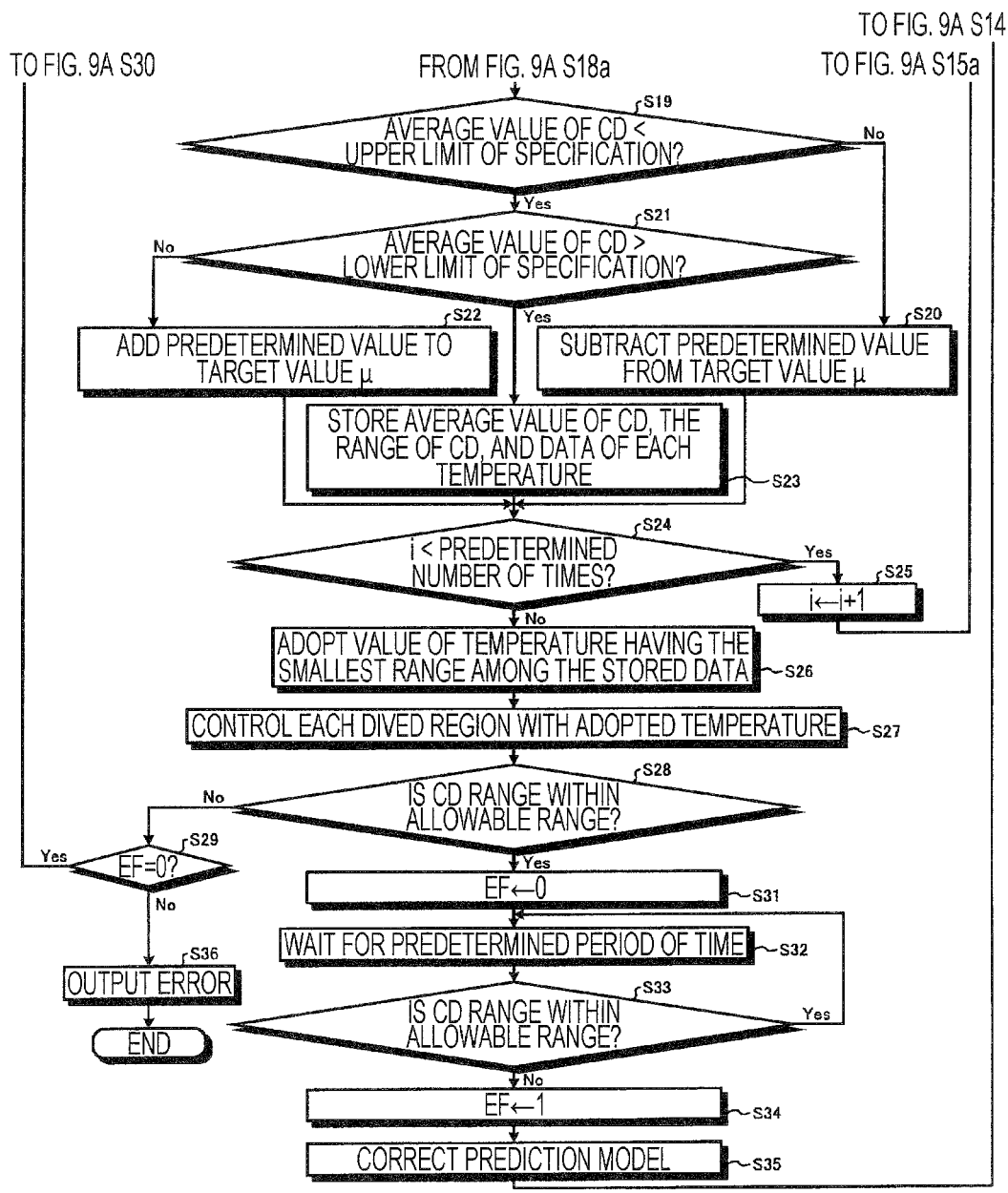

Next, descriptions will be made on a temperature control method using the substrate processing apparatus 10 according to a second exemplary embodiment. FIGS. 9A and 9B are flowcharts illustrating an example of the flow of a temperature control method according to a second exemplary embodiment. Since some steps of the temperature control method according to the second exemplary embodiment are the same as those of the temperature control method according to the first exemplary embodiment illustrated in FIGS. 8A and 8B, the same steps are denoted by the same reference numerals, and descriptions thereof will be omitted. Thus, different steps will be primarily described.

Further, the generation unit 102a generates from the acquired data a first prediction model in which the CD of the measurement point is modeled by the linear function of the temperature of the heater HT, and a second prediction model in which the CD of the measurement point is modeled by a function of a second order or higher of the temperature of the heater HT, or a sum of an exponential function of reciprocal of the absolute temperature of the heater and a constant (step S13a). For example, the generation unit 102a performs fitting using the measured CD and the temperature of each heater HT at each measured point, thereby obtaining a function for predicting the CD at the measurement point by a linear function of the temperature T of each heater HT and a function for predicting the CD of the measurement point by a quadratic function of the temperature T of each heater HT.

Using the generated first prediction model, the calculation unit 102b calculates the temperature $\tau^*_n$ of the heater HT in each divided region where the square sum of errors of the CD at each measurement point with respect to the target value p is minimized (step S15a).

The calculation unit 102b calculates the CD at each measurement point by individually changing, i.e., increasing or decreasing the temperature of the heater HT by a predetermined temperature (e.g., 1 degree) based on the calculated temperature $\tau^*_n$ of the heater HT in each divided region, using the second prediction model, and specifies the combination of the temperatures of the heaters HT in the respective divided regions where the range of the CD is minimized (step S16a).

The calculation unit 102b calculates the temperature of the heater HT in each divided region where the range of the CD is minimized, for example, according to the GRG method using the second prediction model with a value obtained by adding the random number as an initial value (step S18a).

In this manner, the substrate processing apparatus 10 according to the second exemplary embodiment generates the first prediction model in which the CD at the measurement point is modeled by a linear function of the temperature of the heater HT. Further, the substrate processing apparatus 10 generates the second prediction model in which the CD at the measurement point is modeled by a quadric function of the temperature of the heater HT. Since the second prediction model is modeled by a quadratic function, the CD may be predicted more accurately than the first prediction model. The substrate processing apparatus 10 calculates the temperature of the heater HT in each divided region where the square sum of errors of the CD is minimized, using the first prediction model. In the second prediction model, the temperature of the heater HT in each divided region where the square sum of errors is minimized may not be calculated in some cases. Therefore, the substrate processing apparatus 10 calculates the temperature of the heater HT in each divided region where the square sum of errors is minimized, using the first prediction model. Using the second prediction model, the substrate processing apparatus 10 calculates the target temperature of the heater HT in each divided region where the difference between the maximum value and the minimum value of the CD at each measurement point is minimized, by changing the temperature of the heater HT in each divided region based on the calculated temperature of each divided region. Therefore, the substrate processing apparatus 10 may accurately calculate the temperature of the heater HT at which the CD uniformity of the wafer W increases, compared with the case where the target temperature of the heater HT is calculated using the first prediction model.

Third Exemplary Embodiment

Next, a third exemplary embodiment will be described. Since the plasma processing apparatus 1 according to the third exemplary embodiment has the same configuration as that of the substrate processing system 1 according to the first and second exemplary embodiments illustrated in FIG. 1, descriptions thereof will be omitted.

Figure 10:
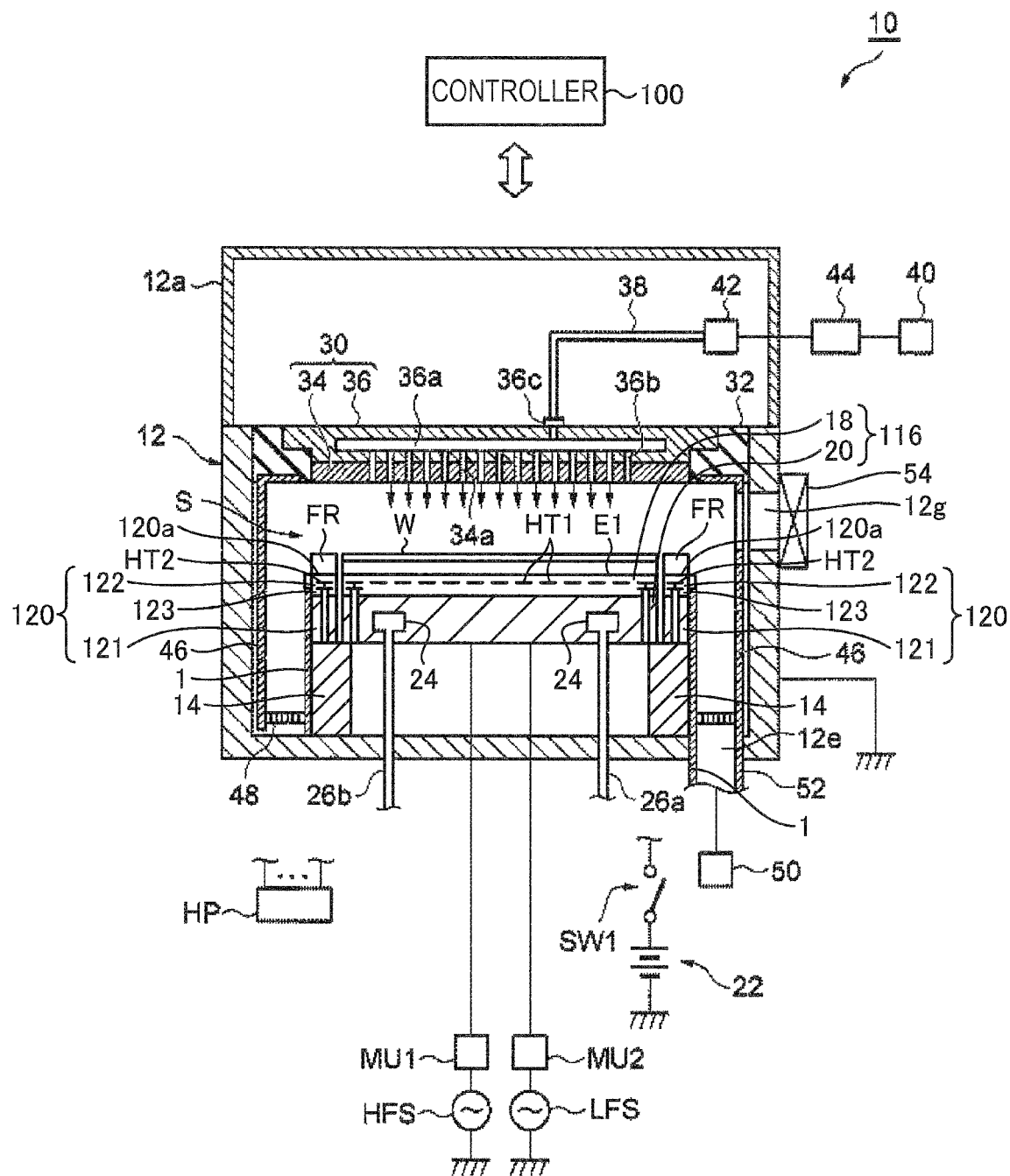
FIG. 10 is a view schematically illustrating a substrate processing apparatus according to a third exemplary embodiment.

The configuration of a substrate processing apparatus 10 according to the third exemplary embodiment will be described. FIG. 10 is a view schematically illustrating the substrate processing apparatus according to the third exemplary embodiment. Since some parts of the substrate processing apparatus according to the third exemplary embodiment have the same configuration as those of the substrate processing apparatus 10 according to the first and second exemplary embodiments illustrated in FIG. 2, the same parts are denoted by the same reference numerals, and descriptions thereof will be omitted. Thus, different parts will be mainly described.

The substrate processing apparatus 10 includes a first placing table 116 provided in the processing container 12. The upper surface of the first placing table 116 is formed in a substantially disc shape having the same size as the wafer W. The first placing table 116 corresponds to the placing table 16 illustrated in FIG. 2 and includes a support member 18 and a base 20.

Further, the substrate processing apparatus 10 includes a second placing table 120 provided around the outer peripheral surface of the first placing table 116. The second placing table 120 is formed in a cylindrical shape whose inner diameter is larger than the outer diameter of the first placing table 2 by a predetermined size and is disposed coaxially with the first placing table 116. The second placing table 120 has an upper surface serving as a placement surface 120a on which a ring member arranged to surround the wafer W is placed. In the present exemplary embodiment, an annular focus ring FR is placed on the placement surface 120a as the ring member.

The second placing table 120 includes a base 121 and a focus ring heater 122. The base 121 is made of, for example, aluminum having an anodized film formed on the surface thereof. The base 121 is supported by the supporting portion 14. The focus ring heater 122 is supported by the base 121. The focus ring heater 122 is formed in an annular shape with a flat upper surface, and the upper surface serves as the placement surface 120d on which the focus ring FR is placed. The focus ring heater 122 includes a heater HT2 and an insulator 123. The heater HT2 is provided inside the insulator 123 and is enclosed in the insulator 123.

Figure 11:
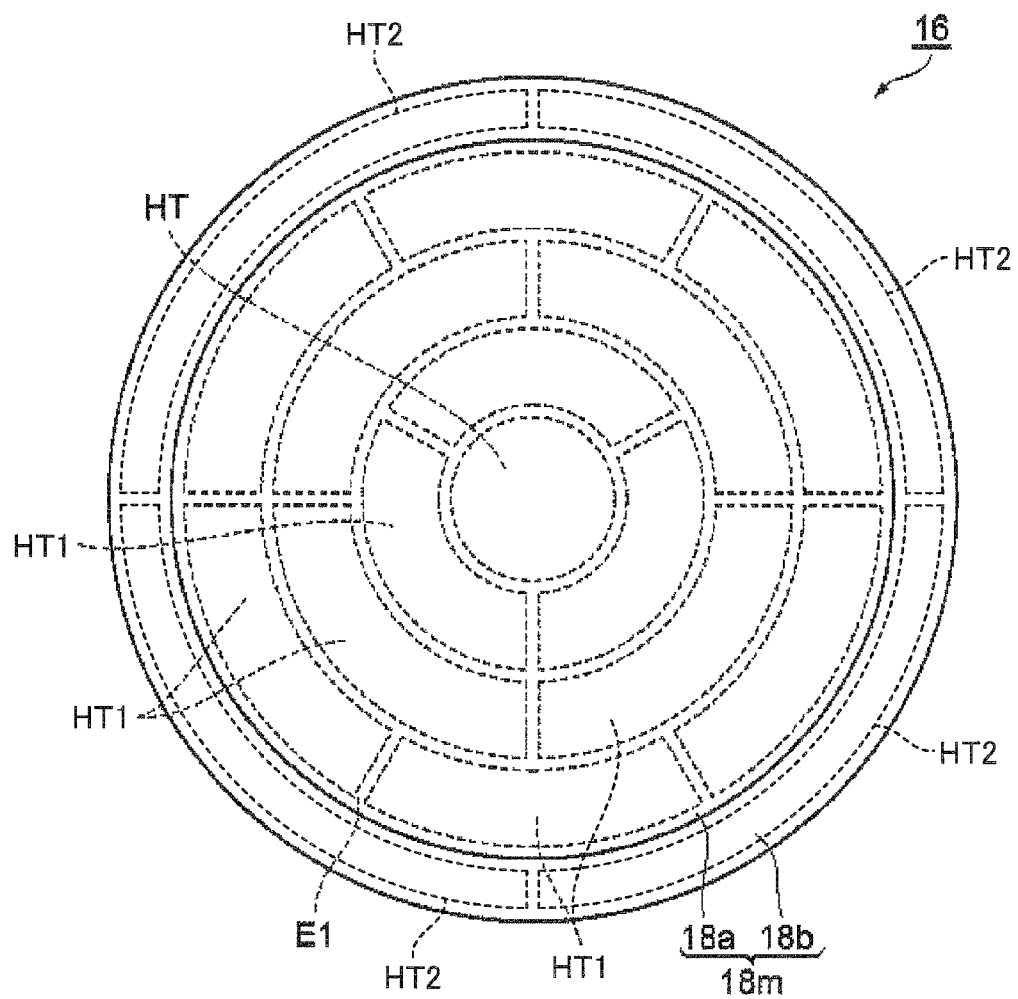
FIG. 11 is a plan view illustrating a first placing table and a second placing table according to the third exemplary embodiment.

FIG. 11 is a plan view illustrating the first placing table and the second placing table according to the third exemplary embodiment. As described above, the upper surface of the first placing table 116 is formed in a substantially disc shape having the same size as the wafer and provides a placement region 18a. The placement region 18a is a substantially circular region in a plan view. A wafer W is placed on the upper surface of the placement region 18a. The second placing table 120 is formed in a substantially cylindrical shape so as to surround the first placing table 116, and provides an outer peripheral region 18b. The outer peripheral region 18b is an annular region in a plan view. The focus ring FR is placed on the upper surface of the outer peripheral region 18b.

Similarly to the first and second exemplary embodiments, the placement region 18a is divided into a plurality of divided regions, and a heater HT1 is provided in each of the divided regions. The heater HT1 corresponds to the heater HT illustrated in FIG. 2.

The outer peripheral region 18b is also divided into a plurality of divided regions, and a heater HT2 is provided in each of the divided regions. For example, as illustrated in FIG. 11, the outer peripheral region 18b is divided into a plurality of divided regions in the circumferential direction, and a heater HT2 is provided in each of the divided regions. Here, the dividing method of the divided regions illustrated in FIG. 11 is an example, and is not limited thereto. The outer peripheral region 18b may be divided into more divided regions. For example, the outer peripheral region 18b may be divided into divided regions having smaller angular width and narrower radial width as they are closer to the outer circumference.

The heaters HT1 and HT2 are individually connected to a heater power source HP illustrated in FIG. 10 via wirings (not illustrated). Each of the heaters HT1 and HT2 is supplied with an individually adjusted power from the heater power source HP.

The operation of the substrate processing apparatus 10 configured as described above is generally controlled by the controller 100. The controller 100 has the same configuration as the controller 100 according to the first and second exemplary embodiments illustrated in FIG. 4, and includes a communication interface 101, a process controller 102, a user interface 103, and a memory 104.

The process controller 102 functions as various processing units by the operation of the control program. For example, the process controller 102 has functions of a generation unit 102a, a calculation unit 102b, a plasma control unit 102c, and a heater control unit 102d.

However, in the substrate processing (e.g., plasma etching), when the temperature of the focus ring FR is controlled by providing the heater HT2 on the second placing table 120 as in the substrate processing apparatus 10 according to the present exemplary embodiment, the progress of the processing in the vicinity of the outer periphery of the wafer W also changes depending on the temperature of the heater HT2. For example, in the plasma etching, when the temperature of the heater HT2 increases, the temperature of the focus ring FR increases. In addition, in the plasma etching, when the temperature of the focus ring FR increases, plasma is consumed in the vicinity of the upper portion of the focus ring FR, so that the plasma density in the vicinity of the outer periphery of the wafer W is reduced. Thus, a phenomenon occurs in which the progress of etching in the vicinity of the outer periphery of the wafer W is reduced.

As described above, in the plasma etching, as the temperature of the wafer W increases, the etching progresses more rapidly. On the contrary, however, as the temperature of the focus ring FR increases, the progress of etching in the vicinity of the outer periphery of the wafer W is reduced.

Therefore, in the substrate processing apparatus 10 according to the present exemplary embodiment, the temperatures of the heaters HT1 and HT2 are used as parameters to implement a situation where the range of the CD on the entire surface of the wafer W is smaller and the average value of the CD is close to the target value.

Here, the prediction model will be described. When the influence of the temperatures of the heater HT1 and the heater HT2 is taken into consideration, the CD of the measurement point has a relationship of the following equation (23).

$$CD = CD_0 + \frac{\partial CD}{\partial T_{FR}} \cdot \Delta T_{FR} \qquad (23)$$

Here, $CD_0$ is a term for predicting the CD of the measurement point from the temperature T of the heater HT1 (model part). The above equation (5-1) corresponds to the equation used for predicting $CD_0$. $T_{FR}$ is a temperature of the heater HT2 of the focus ring FR portion. $\partial CD/\partial T_{FR} \cdot \Delta T_{FR}$ is a term for predicting the influence of the temperature of the heater HT2 of the focus ring FR portion on the CD (model part).

In consideration of the influence of the temperature of the heater HT1 of the other divided region, when the temperature T of the measurement point is close to the average temperature $T_a$ of the three or more temperatures at which the CD is measured, the CD may be approximated by a quadratic function of r as expressed by equation (21-1), as described above. Therefore, in consideration of the influence of the temperature of the heater HT2 as well, when the temperature T of the measurement point is close to the average temperature $T_a$ of three or more temperatures at which the CD is measured, and the temperature $T_{FR}$ of the heater HT2 is close to the average temperature $T_{FR\_a}$ of the heater HT2 at which the CD is measured, the CD may be approximated by a linear function using τ and ξ as expressed by the following equation (24-1). In addition, the CD may be approximated by a quadratic function using τ and ξ as expressed by the following equation (24-2).

$$CD = A_{10} + A_{11} \cdot \tau + F_{11} \cdot \xi \qquad (24\text{-}1)$$

$$CD = A_{20} + A_{21} \cdot \tau + A_{22} \cdot \tau^2 + F_{21} \cdot \xi + F_{22} \cdot \xi^2 \qquad (24\text{-}2)$$

Here, τ is a difference from the average temperature $T_a$ of the temperature T of the measurement point, as expressed by the above equation (16-1). ξ is a temperature indicated by the difference between the average temperature $T_{FR\_a}$ and the temperature $T_{FR}$ of the heater HT2 when the CD is measured, and $\xi = T_{FR} - T_{FR\_a}$.

Equation (24-1) is a model approximated by a linear function. The first and second terms on the right side of equation (24-1) are expressions on the right side of the above equation (4-1), and are terms for predicting the CD of the measurement point from the temperature r of the heater HT1. $A_{10}$ and $A_{11}$ are coefficients. The third term on the right side of equation (24-1) is a term for predicting the influence on the CD from the temperature ξ of the heater HT2. $F_{11}$ is a coefficient.

Equation (24-2) is a model approximated by a quadric function. The first to third terms on the right side of equation (24-2) are expressions on the right side of the above equation (21-1), and are terms for predicting the CD of the measurement point from the temperature r of the heater HT1. The fourth and fifth terms on the right side of equation (24-2) are terms for predicting the influence on the CD from the temperature ξ of the heater HT2. $F_{21}$ and $F_{22}$ are coefficients.

Equation (24-2) may be obtained individually as an equation for obtaining the CD at each measurement point in each divided region.

In order to obtain data used for generating the prediction model, the substrate processing apparatus 1 according to the present exemplary embodiment controls each of the heaters HT1 and HT2 to vary the temperature of each divided region in several levels and exchange the wafers W at each temperature, so that plasma etching actually performed on the wafers W is individually performed thereon. For example, the substrate processing apparatus 10 controls each heater HT1 to three or more temperatures while keeping the temperature of each heater HT2 constant, exchanges the wafers W at each temperature, and individually performs the actually performed plasma etching. As an example, the substrate processing apparatus 10 performs plasma etching on the wafers W in the state where each heater HT1 is set to 50° C. Further, the substrate processing apparatus 10 performs plasma etching on the wafers W in the state where each heater HT1 is set to 55° C. Further, the substrate processing apparatus 10 performs plasma etching on the wafers W in the state where each heater HT1 is set to 45° C. Further, the substrate processing apparatus 10 controls each heater HT2 at two or more temperatures while keeping each heater HT1 constant, exchanges the wafers W at each temperature, and individually performs the actually performed plasma etching.

Each wafer W on which plasma etching is performed at each temperature is conveyed to the measurement apparatus 11. The measurement apparatus 11 measures the CD of the measurement point with respect to each of the conveyed wafers W using a predetermined position as a measurement point. The measurement apparatus 11 transmits the data of the CD measured at each measurement point to the substrate processing apparatus 10.

Therefore, it is possible to obtain data to which $\tau$, $\tau^2$, $\xi$, $\xi^2$, and the CD value of the measurement point correspond for each measurement point, as expressed by the following equation (25).

| No | $\tau$ | $\tau^2$ | $\xi$ | $\xi^2$ | CD | (25) |
|---|---|---|---|---|---|---|
| 1 | $\tau_1$ | $\tau_1^2$ | $\xi_1$ | $\xi_1^2$ | $CD_1$ | |
| 2 | $\tau_2$ | $\tau_2^1$ | $\xi_2$ | $\xi_2^2$ | $CD_2$ | |
| ⋮ | ⋮ | ⋮ | ⋮ | ⋮ | ⋮ | |
| i | $\tau_i$ | $\tau_i^2$ | $\xi_i$ | $\xi_i^2$ | $CD_i$ | |
| ⋮ | ⋮ | ⋮ | ⋮ | ⋮ | ⋮ | |
| n | $\tau_n$ | $\tau_n^2$ | $\xi_n$ | $\xi_n^2$ | $CD_n$ | |

Here, n is a number of wafers W subjected to plasma etching in order to obtain data used for generating the prediction model. $\tau_n$ is a temperature $\tau$ of the heater HT1 of the divided region provided with the measurement point when the plasma etching is performed on the n-th wafer W. $\xi_n$ is a temperature $\xi$ of the heater HT2 when the plasma etching is performed on the n-th wafer W. CDn is a value of the CD at the measurement point when the plasma etching is performed on the n-th wafer W.

The generation unit 102a generates a first prediction model in which the CD of the measurement point is modeled by the linear function of the temperatures of the heaters HT1 and HT2 from the received data of the CD. For example, the generation unit 102a performs fitting on equation (24-1) using the CD at each measurement point and the temperature of each of the heaters HT1 and HT2 to obtain the values of the coefficients $A_{10}$, $A_{11}$, and $F_{11}$, and substitutes the obtained coefficients $A_{10}$, $A_{11}$, and $F_{11}$ into equation (24-1) to obtain, as the first prediction model, a function for predicting the CD of the measurement point by a linear function of the temperature $\tau$ of each heater HT1 and the temperature $\xi$ of each heater HT2. For example, the generation unit 102a obtains equation (24-1) as the first prediction model.

Further, the generation unit 102a generates a second prediction model in which the CD of the measurement point is modeled by a quadric function of the temperatures of the heaters HT1 and HT2 from the received data of the CD. For example, the generation unit 102a performs fitting on the above equation (24-2) using the CD of the measurement point and the temperature of each of the heaters HT1 and HT2 based on the data of the CD of the measurement point of each wafer W expressed by equation (25), for each measurement point, to obtain the values of the coefficients $A_{20}$, $A_{21}$, $A_{22}$, $F_{21}$, and $F_{22}$. For example, the generation unit 102a performs fitting to obtain the values of the coefficients $A_{20}$, $A_{21}$, $A_{22}$, $F_{21}$, and $F_{22}$ that minimize the residual square sum.

For example, $S_{jk}$ and $S_{kj}$ are defined as in the following equation (26-1), $S_{jCD}$ is defined as in the following equation (26-2), $x_{i1}$ is expressed by the following equation (26-3), $x_{i2}$ is expressed by the following equation (26-4), $x_{i3}$ is expressed by the following equation (26-5), and xi is expressed by the following equation (26-6).

$$S_{jk} = S_{kj} = \sum_{i=1}^{n}(x_{ij} - \overline{x}_j)(x_{ik} - \overline{x}_k) \quad (26\text{-}1)$$

$$S_{jCD} = \sum_{i=1}^{n}(x_{ij} - \overline{x}_j)(CD_i - \overline{CD}) \quad (26\text{-}2)$$

$$x_{i1} = \tau_i \quad (26\text{-}3)$$

$$x_{i2} = \tau_i^2 \quad (26\text{-}4)$$

$$x_{i3} = \xi_i \quad (26\text{-}5)$$

$$x_{i4} = \xi_i^2 \quad (26\text{-}6)$$

Here, $\overline{x}_j$ is an average value of xj. $\overline{x}_k$ is an average value of xk. $\overline{CD}$ is an average value of the CD.

When the residual square sum is minimized, the relationship of the following equations (27-1) to (27-5) is satisfied.

$$\overline{CD} = \hat{A}_{20} + \hat{A}_{21}\overline{\tau} + \hat{A}_{22}\overline{\tau^2} + \hat{F}_{21}\overline{\xi} + \hat{F}_{22}\overline{\xi^2} \quad (27\text{-}1)$$

$$\hat{A}_{21}\cdot S_{11} + \hat{A}_{22}\cdot S_{12} + \hat{F}_{21}\cdot S_{13} + \hat{F}_{22}\cdot S_{14} = S_{1CD} \quad (27\text{-}2)$$

$$\hat{A}_{21}\cdot S_{21} + \hat{A}_{22}\cdot S_{22} + \hat{F}_{21}\cdot S_{23} + \hat{F}_{22}\cdot S_{24} S_{2CD} \quad (27\text{-}3)$$

$$\hat{A}_{21}\cdot S_{31} + \hat{A}_{22}\cdot S_{32} + \hat{F}_{21}\cdot S_{33} + \hat{F}_{22}\cdot S_{34} = S_{3CD} \quad (27\text{-}4)$$

$$\hat{A}_{21}\cdot S_{41} + \hat{A}_{22}\cdot S_{42} + \hat{F}_{21}\cdot S_{43} + \hat{F}_{22}\cdot S_{44} = S_{4CD} \quad (27\text{-}5)$$

Equations (27-2) to (27-5) may be transformed as in equation (28) when a matrix is used.

$$\begin{bmatrix} \hat{A}_{21} \\ \hat{A}_{22} \\ \hat{F}_{21} \\ \hat{F}_{22} \end{bmatrix} = \begin{bmatrix} S_{11} & S_{14} \\ S_{21} & S_{24} \\ S_{31} & \cdots & S_{34} \\ S_{41} & S_{44} \end{bmatrix}^{-1} \begin{bmatrix} S_{1CD} \\ S_{2CD} \\ S_{3CD} \\ S_{4CD} \end{bmatrix} \quad (28)$$

Using the above equation (25), the generation unit 102a obtains $S_{jk}$ and $S_{jCD}$ for j=1 to 4 and k=1 to 4, respectively, from equations (26-1) to (26-6), which are then substituted into equation (28) to obtain the values of the coefficients $A_{21}$, $A_{22}$, $F_{21}$, and $F_{22}$.

The generation unit 102a calculates the obtained coefficients $A_{21}$, $A_{22}$, $F_{21}$, and $F_{22}$, the average value $\overline{\tau}$ of $\tau$, the average value $\overline{\tau_2}$ of $\tau_2$, the average value $\overline{\xi}$ of $\xi$, the average value $\overline{\xi_2}$ of $\xi_2$ into equation (27-1) to obtain the value of the coefficient $A_{20}$.

Then, the generation unit 102a generates the second prediction model by substituting the obtained coefficients $A_{20}$, $A_{21}$, $A_{22}$, $F_{21}$, and F into equation (24-2).

Using the first and second prediction models generated by the generation unit 102a, the calculation unit 102b calculates a target temperature of each of the heaters HT1 and HT2 in each divided region in which the CD of the measurement point satisfies the predetermined condition.

For example, similarly to the second exemplary embodiment, using the first prediction model, the calculation unit 102b calculates the temperature $\tau^*_n$ of the heater HT1 and the temperature $\xi^*_n$ of the heater HT2 in each divided region where the square sum of errors of the CD at each measurement point with respect to the target value p is minimized.

Ten, using the second prediction model, the calculation unit 102b calculates the target temperature of each of the heaters HT1 and HT2 in each divided region where the difference between the maximum value and the minimum value of the critical dimension at each measurement point is minimized, by changing the temperature of each of the heaters HT1 and HT2 in each divided region based on the calculated temperature of each of the heaters HT1 and HT2 in each divided region. For example, using the above equation (24-2), the calculation unit 102b calculates the target temperatures of the heaters HT1 and HT2 in each divided region where the range of the CD at each measurement point is minimized, by changing the temperatures of the heaters HT1 and HT2 based on the temperature $\tau^*_n$ of the heater HT1 and the temperature $\xi^*_n$ of the heater HT2 in each divided region where the square sum of errors is minimized. For example, the calculation unit 102b calculates the CD at each measurement point by individually changing, i.e., increasing or decreasing the temperature $\tau$ of the heater HT1 by a predetermined temperature based on the temperature $\tau^*_n$ of the heater HT1 in each divided region and by changing, i.e., increasing or decreasing the temperature $\xi$ of the heater HT2 by a predetermined temperature based on the temperature $\xi^*_n$ of the heater HT2, and specifies the combination of the temperatures of the heaters HT1 and HT2 in the respective divided regions where the range of the CD is minimized. Then, the calculation unit 102b calculates the target temperature of each of the heaters HT1 and HT2 in each divided region where the range of the CD is minimized, by setting as an initial value a value obtained by individually adding a random number to the temperature of the heater HT1 in each divided region, with respect to the combination of the temperatures of the heaters HT1 and HT2 in each of the specified divided regions, for example by using the GRG method. The calculation unit 102b may calculate the target temperature of each of the heaters HT1 and HT2 in each divided region where the range of the CD is minimized, by repeatedly calculating the CD at each measurement point by changing the temperature of each of the heaters HT1 and HT2 in each divided region at random or with a predetermined rule with a temperature width smaller than a predetermined temperature, with respect to the combination of the temperatures of the heaters HT1 and HT2 in the respective specified divided regions.

Under the control of the plasma control unit 102c, the heater control unit 102d performs a control such that each of the heaters HT1 and HT2 in each divided region becomes the target temperature calculated by the calculation unit 102b when the plasma etching is performed on the wafer W. For example, the heater control unit 102d controls the heater power source HP such that each of the heaters HT1 and HT2 is supplied with a power in accordance with each target temperature.

As described above, the substrate processing apparatus 10 according to the third exemplary embodiment includes the placing tables (the first placing table 116 and the second placing table 120) including the placement surface on which the wafer W and the focus ring FR arranged to surround the wafer W are placed, and provided with the heaters HT1 and HT2 each capable of adjusting a temperature in each divided region obtained by dividing the placement surface. The substrate processing apparatus 10 calculates a target temperature of each of the heaters HT1 and HT2 in each divided region in which a critical dimension at a predetermined measurement point of the wafer W satisfies a predetermined condition when a predetermined substrate processing is performed on the wafer W placed on the placement surface, using a prediction model that predicts the critical dimension of the measurement point by using a temperature of each of the heaters HT1 and HT2 in each divided region as a parameter and taking into consideration an influence of a temperature of a heater HT1 or HT2 in a divided region other than a divided region including the measurement point in accordance with a distance between the measurement point and the other divided region. When the substrate processing is performed on the wafer W placed on the placement surface, the substrate processing apparatus 10 performs a control such that each of the heaters HT1 and HT2 in each divided region reaches the target temperature. Therefore, the substrate processing apparatus 10 may control the temperature of each of the heaters HT1 and HT2 in each divided region such that the CD at the measurement point of the wafer W satisfies the predetermined condition.

Fourth Exemplary Embodiment

Next, a fourth exemplary embodiment will be described. Since the substrate processing system 1 and the substrate processing apparatus 10 according to the fourth exemplary embodiment have the same configuration as those of the substrate processing system 1 and the substrate processing apparatus 10 according to the first to third exemplary embodiments illustrated in FIGS. 1 to 3, 10, and 11, descriptions thereof will be omitted. In the following description, the fourth embodiment will be described using the configuration of the substrate processing apparatus 10 according to the first and second exemplary embodiments illustrated in FIGS. 1 to 3, but the fourth exemplary embodiment may be applied to the configuration of the substrate processing apparatus 10 according to the third exemplary embodiment illustrated in FIGS. 10 and 11.

Figure 12:
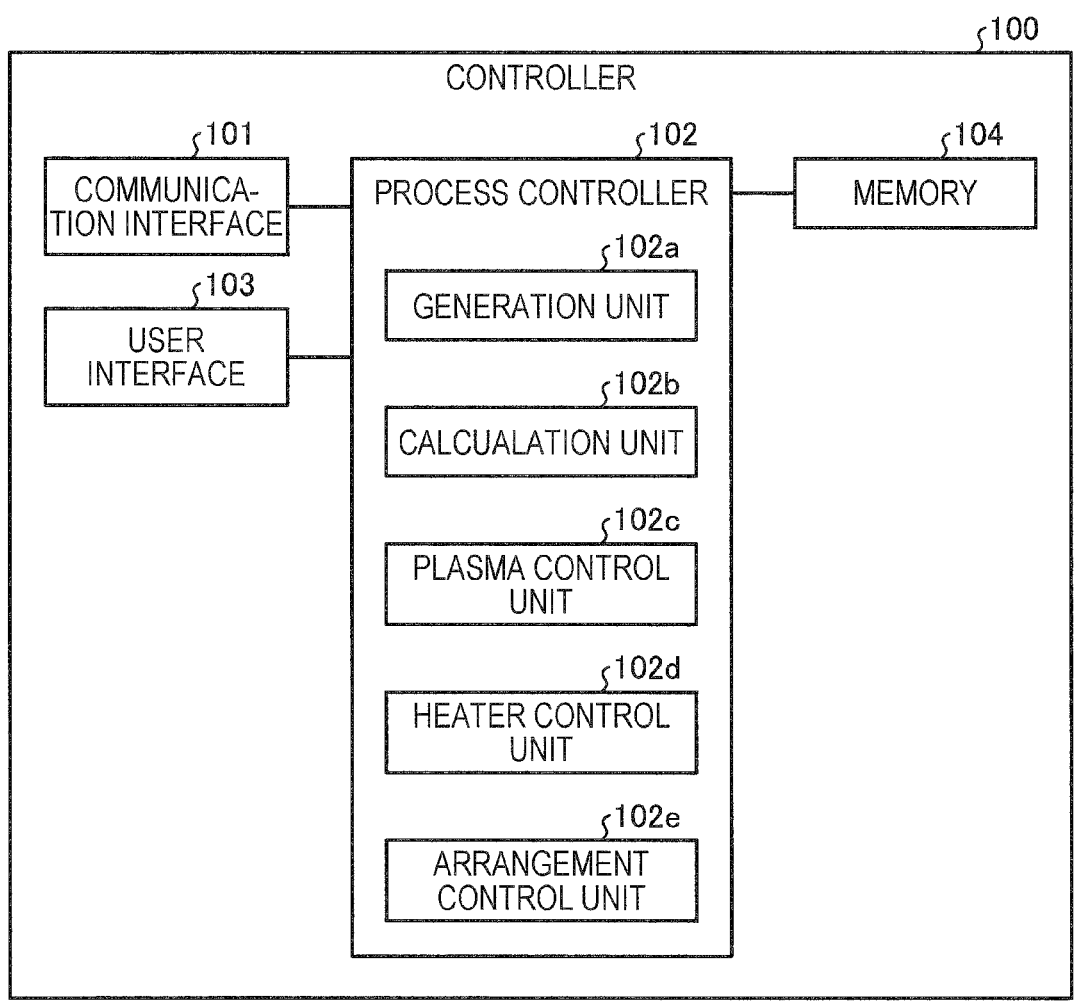
FIG. 12 is a block diagram illustrating a schematic configuration of a controller that controls a substrate processing apparatus according to a fourth exemplary embodiment.

FIG. 12 is a block diagram illustrating a schematic configuration of a controller that controls a substrate processing apparatus according to the fourth exemplary embodiment. Since some parts of the controller 100 that controls the substrate processing apparatus according to the fourth exemplary embodiment have the same configuration as those of the controller 100 according to the first to third exemplary embodiments illustrated in FIG. 4, the same parts are denoted by the same reference numerals, and descriptions thereof will be omitted. Thus, different parts will be mainly described.

The process controller 102 of the controller 100 that controls the substrate processing apparatus according to the fourth exemplary embodiment further has a function of an arrangement control unit 102e.

Here, as described above, in the substrate processing (e.g., plasma etching), it is desired that the range of the CD over the entire surface of the wafer W is small. The range of the CD is a difference between the maximum value of the CD and the minimum value of the CD.

In the substrate processing apparatus 10, plasma etching is performed on the wafer W, using the temperature of the heater HT in each divided region as a target temperature calculated by the calculation unit 102b. Thus, the range of the CD at each measurement point of the wafer W is minimized.

Meanwhile, the maximum point at which the CD at the measurement point of the wafer W is maximized and the minimum point at which CD is minimized may be positioned within the same divided region in some cases.

FIGS. 13A to 13C are diagrams schematically illustrating the maximum point and the minimum point of the CD on the wafer. In FIG. 13A, a maximum point P1 where the CD of the measurement point is maximized on the wafer W and the minimum point P2 where the CD is minimized are illustrated. Further, in FIG. 13A, a placing region 18a on which the wafer W of the placing table 16 is placed is schematically illustrated. The placement region 18a is divided into a plurality of divided regions, and a heater HT is provided in each of the divided regions. In the present exemplary embodiment, the placement region 18a is divided into five divided regions including a central circular region 150 and four annular regions 151 surrounding the circular region. That is, at least a part (annular region 151) of each of the divided regions obtained by dividing the placement region 18a is provided along the circumferential direction of the wafer W in the placing table 16. Each divided region (the circular region 150 and the annular regions 151) is provided with a heater HT.

When the wafer W illustrated in part (A) of FIG. 13 is placed in the placing region 18a, the maximum point P1 and the minimum point P2 are positioned in the same divided region as illustrated in FIG. 13B. In the example of FIG. 13B, the maximum point P1 and the minimum point P2 are positioned in the same annular region 151. The CD at the measurement point changes in accordance with the temperature of the heater HT. However, in the case where the maximum point P1 and the minimum point P2 are positioned in the same divided region, the CD at the maximum point P and the minimum point P2 are subjected to the temperature control of the same heater HT, so that the CD similarly change in accordance with the temperature change of the heater HT. Therefore, it is difficult to further reduce the range of the CD.

In such a case, as illustrated in FIG. 13C, when the wafer W is rotated and placed on the placing region 18a, the maximum point P1 and the minimum point P2 may be arranged in different divided regions. In the example of FIG. 13C, the maximum point P1 and the minimum point P2 may be arranged in different annular regions 151. In the case where the maximum point P1 and the minimum point P2 are arranged in different divided regions in this manner, since the temperature may be controlled by another heater HT, it is possible to further reduce the range of the CD.

Therefore, using the prediction model generated by the generation unit 102a, the arrangement control unit 102e calculates the CD at each measurement point when the target temperature of each heater HT is used. A value measured by the measurement apparatus 11 by actually performing the plasma etching may be used as the CD of the measurement point.

The arrangement control unit 102e specifies the maximum point at which the CD is maximized and the minimum point at which the CD is minimized among the CD at the respective measurement points. The arrangement control unit 102e determines whether the maximum point and the minimum point are positioned in the same divided region. For example, the arrangement control unit 102e determines whether the maximum point and the minimum point are positioned in the same divided region provided along the circumferential direction of the wafer W. As a result of the determination, when the maximum point and the minimum point are positioned in the same divided region, the arrangement control unit 102e controls the arrangement of the wafer W with respect to the placement surface such that the maximum point and the minimum point are positioned in different divided regions. For example, when the maximum point and the minimum point are positioned in the same divided region provided along the circumferential direction of the wafer W, the arrangement control unit 102e performs a control to rotate the wafer W in the circumferential direction such that the maximum point and the minimum point are positioned in different divided regions. For example, the arrangement control unit 102e performs a control to rotate the wafer W in the circumferential direction such that the intermediate position between the maximum point and the minimum point is positioned at the boundary of the divided regions. For example, the arrangement control unit 102e performs a control to rotate the wafer W in the circumferential direction in a conveyance system that conveys the wafer W to the substrate processing apparatus 10. The conveyance system is provided with an alignment device and a robot arm before the substrate processing apparatus 10. The alignment device is provided with a horizontal rotary stage and is capable of adjusting various kinds of alignment such as, for example, adjustment of rotational position of the wafer W. The robot arm holds the wafer W and conveys the wafer W to each device of the conveyance system. For example, the arrangement control unit 102e transmits control information for rotating the wafer W in the circumferential direction with respect to the alignment device or the robot arm, and performs a control to rotate the wafer W in the circumferential direction such that the intermediate position between the maximum point and the minimum point is positioned at the boundary of the divided regions.

The substrate processing apparatus 10 may regenerate a prediction model when the arrangement of the wafer W with respect to the placement surface is changed in this manner. For example, the substrate processing apparatus 10 controls each heater HT to vary the temperature of each divided region in several levels and exchange the wafers W at each temperature, so that the actually performed plasma etching is individually performed. Each wafer W subjected to the plasma etching processing at each temperature is moved to the measurement apparatus 11, and the CD of the measurement point is measured by the measurement apparatus 11 with the predetermined position of the wafer W as a measurement point. The measurement apparatus 11 transmits the data of the CD measured at each measurement point to the substrate processing apparatus 10. The generation unit 102a regenerates a prediction model from the received data of the CD. Using the prediction model generated by the generation unit 102a, the calculation unit 102b may calculate a target temperature of the heater HT in each divided region in which the CD of the measurement point satisfies the predetermined condition.

In a case where change characteristic data indicating the change of the CD with respect to the temperature change is obtained, the substrate processing apparatus 10 may use the prediction model before changing the arrangement of the wafer W with respect to the placement surface to calculate a target temperature of the heater HT in each divided region. For example, the calculation unit 102b specifies the heaters HT corresponding to the respective measurement points based on the rotation angle obtained by rotating the wafer W. For each measurement point, the calculation unit 102b corrects the prediction model such that the value of the CD is corrected according to the difference between the temperature of the heater HT before the arrangement of the wafer W and the temperature of the heater HT after the change, based on the change characteristic data to correct the prediction model. Using the corrected prediction model, the calculation unit 102b may calculate a target temperature of the heater HT in each divided region in which the CD of the measurement point satisfies a predetermined condition.

As described above, when the maximum point at which the CD at the measurement point of the wafer W is maximized and the minimum point at which the CD is minimized are positioned in the same divided region, the substrate processing apparatus 10 according to the fourth exemplary embodiment controls the arrangement of the wafer W with respect to the placement surface such that the maximum point and the minimum point are positioned in different divided regions. Therefore, the substrate processing apparatus 10 may control the temperature of the maximum point at which the CD is maximized and the minimum point at which the CD is minimized, by another heater HT. Thus, it is possible to further reduce the range of the CD.

In the above-described exemplary embodiments, the substrate processing is performed on a semiconductor wafer as a substrate, but the present disclosure is not limited thereto. Any substrate may be used as long as the progress of the substrate processing is affected depending on the temperature.

Further, in the above-described exemplary embodiments, plasma etching is performed as a substrate processing, but the present disclosure is not limited thereto. Any substrate processing may be used as long as the progress of the processing is affected depending on the temperature.

In the third exemplary embodiment, descriptions have been made on an exemplary case where the placing table is divided into the first placing table 116 on which the wafer W is placed and the second placing table 120 on which the focus ring FR is placed, but the present disclosure is not limited thereto. A single placing table may be used, and the wafer W and the focus ring FR may be placed on the same flat placement surface.

Further, in the third exemplary embodiment, descriptions have been made on an exemplary case where the focus ring FR is disposed as the ring member, but the present disclosure is not limited thereto. The ring member may be made of, for example, an insulating material (e.g., quartz), and may be an insulator ring provided for insulation and protection of the placement surface. Further, the ring member may be a focus ring FR and an insulator ring. In this case, for example, the insulator ring is arranged so as to surround the focus ring FR.

Further, in the first to fourth exemplary embodiments, descriptions have been made on an exemplary case where the calculation unit 102b calculates the target temperature of the heater in each divided region where the difference between the maximum value and the minimum value of the critical dimension at each measurement point is minimized, but the present disclosure is not limited thereto. The calculation unit 102b may calculate the target temperature of the heater in each divided region where the square sum of errors of the critical dimension at each measurement point is minimized.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a placing table having a placement surface on which one or both of a substrate and a ring member arranged to surround the substrate are placed, the placement surface being divided into a plurality of regions in each of which a heater is provided so as to adjust a temperature therein;
a calculator configured to calculate a target temperature of the heater in each divided region in which a critical dimension at a predetermined measurement point of the substrate satisfies a predetermined condition when a predetermined substrate processing is performed on the substrate placed on the placement surface, using a prediction model to predict the critical dimension at the measurement point based on a temperature of the heater in each divided region as a parameter and by taking into consideration an influence of a temperature of a heater in another divided region other than a divided region including the measurement point, according to a distance between the measurement point in the divided region and the another divided region; and
a heater controller configured to control the heater in each divided region to reach the target temperature calculated by the calculator when the substrate processing is performed on the substrate placed on the placement surface.

2. The substrate processing apparatus of claim 1, wherein the calculator is configured to calculate the target temperature of the heater in each divided region in which the critical dimension at the measurement point of the substrate satisfies the predetermined condition, using a prediction model to predict the critical dimension at the measurement point by taking into consideration the influence of the temperature of the heater in an adjacent divided region to the divided region including the measurement point, according to the distance between the measurement point and the adjacent divided region.

3. The substrate processing apparatus of claim 1, wherein a plurality of measurement points are determined on the substrate, and
the calculator is configured to calculate the target temperature of the heater in each divided region in which a difference between a maximum value and a minimum value in the critical dimension at each measurement point or a square sum of errors in the critical dimension at each measurement point is minimized, by calculating, using the prediction model, a temperature of the heater in each divided region in which the square sum of errors in the critical dimension at each measurement point with respect to a target dimension is minimized, and changing the temperature of the heater in each divided region based on the calculated temperature of each divided region.

4. The substrate processing apparatus of claim 3, wherein the calculator is configured to calculate the target temperature of the heater in each divided region in which the difference between the maximum value and the minimum value in the critical dimension at each measurement point or the square sum of errors in the critical dimension at each measurement point is minimized in a range of a predetermined specification of the average value in the critical dimension at each measurement point, by changing the temperature of the heater in each divided region based on the calculated temperature of each divided region.

5. The substrate processing apparatus of claim 1, further comprising:
a generator configured to generate the prediction model from data obtained by measuring the critical dimension at the measurement point when the substrate processing is performed on the substrate by controlling the heater in each divided region to three or more temperatures,
wherein the calculator is configured to calculate the target temperature of the heater in each divided region in which the critical dimension at the measurement point satisfies the predetermined condition, using the prediction model generated by the generator.

6. The substrate processing apparatus of claim 5, wherein the generator is configured to generate a first prediction model obtained by modeling the critical dimension at the measurement point by a linear function of the temperature of the heater, and a second prediction model obtained by modeling the critical dimension at the measurement points by a quadratic or higher-order function of the temperature of the heater or a sum of an exponential function of a reciprocal of an absolute temperature of the heater and a constant, and
the calculator is configured to calculate, using the second prediction model, the target temperature of the heater in each divided region in which the difference between the maximum value and the minimum value in the critical dimension at each measurement point is minimized, by calculating, using the first prediction model, a temperature of the heater in each divided region in which the square sum of errors in the critical dimension is minimized, and changing the temperature of the heater in each divided region based on the calculated temperature of each divided region.

7. The substrate processing apparatus of claim 1, wherein the substrate processing is plasma etching, and
the critical dimension is a width of an etching pattern.

8. The substrate processing apparatus of claim 7, wherein the ring member is one or both of a focus ring and an insulator ring.

9. The substrate processing apparatus of claim 1, further comprising:
an arrangement controller that controls an arrangement of the substrate with respect to the placing table such that a maximum point at which the critical dimension at the measurement point of the substrate is maximized and a minimum point at which the critical dimension is minimized are positioned in different divided regions when the maximum point and the minimum point are positioned in the same divided region.

10. The substrate processing apparatus of claim 9, wherein the substrate has a disc shape,
in the placing table, at least a part of each divided region obtained by dividing the placement surface is provided along a circumferential direction of the substrate, and
when the maximum point and the minimum point are positioned in the same divided region provided along the circumferential direction of the substrate, the arrangement controller performs a control to rotate the substrate in the circumferential direction such that the maximum point and the minimum point are positioned in different divided regions.

11. The substrate processing apparatus of claim 1, wherein a generator is configured to generate a first prediction model obtained by modeling the critical dimension at the measurement point by a linear function of the temperature of the heater, and a second prediction model obtained by modeling the critical dimension at the measurement points by a quadratic or higher-order function of the temperature of the heater or a sum of an exponential function of a reciprocal of an absolute temperature of the heater and a constant.

12. A computer-implemented temperature control method comprising:
calculating a target temperature of a heater in each divided region in which a critical dimension at a predetermined measurement point of a substrate satisfies a predetermined condition when a predetermined substrate processing is performed on the substrate placed on a placement surface configured to place thereon one or both of the substrate and a ring member arranged to surround the substrate and provided in a placing table, the placement surface being divided into a plurality of regions in each of which a heater is provided so as to adjust a temperature therein, using a prediction model to predict the critical dimension at the measurement point based on a temperature of the heater in each divided region as a parameter and by taking into consideration an influence of a temperature of a heater in another divided region other than a divided region including the measurement point, according to a distance between the measurement point in the divided region and the another divided region; and
controlling the heater in each divided region to reach the target temperature calculated by a calculator when the substrate processing is performed on the substrate placed on the placement surface.

13. A non-transitory computer-readable storage medium that stores a temperature control program which, when executed, causes a computer to execute a processing including:
calculating a target temperature of a heater in each divided region in which a critical dimension at a predetermined measurement point of a substrate satisfies a predetermined condition when a predetermined substrate processing is performed on the substrate placed on a placement surface configured to place thereon one or both of the substrate and a ring member arranged to surround the substrate and provided in a placing table, the placement surface being divided into a plurality of regions in each of which a heater is provided so as to adjust a temperature therein, using a prediction model to predict the critical dimension at the measurement point based on a temperature of the heater in each divided region as a parameter and by taking into consideration an influence of a temperature of a heater in another divided region other than a divided region including the measurement point, according to a distance between the measurement point in the divided region and the another divided region; and
controlling the heater in each divided region to reach the target temperature calculated by a calculator when the substrate processing is performed on the substrate placed on the placement surface.

* * * * *